US011232964B2

(12) United States Patent
Sakata

(10) Patent No.: US 11,232,964 B2
(45) Date of Patent: Jan. 25, 2022

(54) POD OPENER

(71) Applicant: RORZE CORPORATION, Hiroshima (JP)

(72) Inventor: Katsunori Sakata, Hiroshima (JP)

(73) Assignee: RORZE CORPORATION, Hiroshima (JP)

( * ) Notice: Subject to any disclaimer, the term of this patent is extended or adjusted under 35 U.S.C. 154(b) by 0 days.

(21) Appl. No.: 16/842,770

(22) Filed: Apr. 8, 2020

(65) Prior Publication Data

US 2020/0234987 A1 Jul. 23, 2020

Related U.S. Application Data

(63) Continuation of application No. PCT/JP2018/036321, filed on Sep. 28, 2018.

(30) Foreign Application Priority Data

Oct. 11, 2017 (JP) .............................. JP2017-197918

(51) Int. Cl.
*H01L 21/67* (2006.01)
*H01L 21/673* (2006.01)
(Continued)

(52) U.S. Cl.
CPC ........ *H01L 21/67379* (2013.01); *B65G 47/91* (2013.01); *B67B 7/12* (2013.01);
(Continued)

(58) Field of Classification Search
None
See application file for complete search history.

(56) References Cited

U.S. PATENT DOCUMENTS 4,983,097 A    1/1991  Ema et al.
5,825,470 A *  10/1998 Miyai ..................... G03F 7/707
                                                            355/72
(Continued)

FOREIGN PATENT DOCUMENTS

JP    H2-95622 A    4/1990
JP    H11-217121 A  8/1999
(Continued)

OTHER PUBLICATIONS

International Search Report in PCT Application No. PCT/JP2018/036321, dated Dec. 11, 2018, 5pp.
(Continued)

*Primary Examiner* — Ronald P Jarrett
(74) *Attorney, Agent, or Firm* — Hauptman Ham, LLP

(57) ABSTRACT

A pod opener includes an elevating mechanism elevating the cassette in a vertical direction, a first hook member engaging with an engagement means of the cassette and supporting the cassette, a second hook member supported by the first hook member, a forward and backward movement mechanism moving the first hook member and the second hook member forward and backward with respect to the cassette, an urging member urging the second hook member upward, and an atmosphere maintaining device maintaining an internal space having the cassette disposed therein in a predetermined atmosphere and the second hook member is displaceable with respect to the first hook member.

10 Claims, 13 Drawing Sheets

(51) Int. Cl.
*B65G 47/91* (2006.01)
*B67B 7/12* (2006.01)
*B67B 7/20* (2006.01)
*H01L 21/677* (2006.01)

(52) U.S. Cl.
CPC ............ *B67B 7/20* (2013.01); *H01L 21/6773* (2013.01); *H01L 21/67389* (2013.01); *H01L 21/67706* (2013.01); *H01L 21/67712* (2013.01)

(56) References Cited

U.S. PATENT DOCUMENTS

| | | | |
|---|---|---|---|
| 7,114,908 B1* | 10/2006 | Sarver | H01L 21/67309 414/790.2 |
| 7,731,470 B2* | 6/2010 | Yamamoto | H01L 21/67769 414/331.05 |
| 2002/0018703 A1 | 2/2002 | Kyouno | |
| 2009/0196714 A1 | 8/2009 | Sylvestre et al. | |
| 2010/0102030 A1 | 4/2010 | Kondoh | |
| 2010/0179681 A1 | 7/2010 | Jager et al. | |
| 2014/0210224 A1 | 7/2014 | Hashimoto et al. | |
| 2018/0122674 A1* | 5/2018 | Dovids | H01L 21/67346 |

FOREIGN PATENT DOCUMENTS

| | | |
|---|---|---|
| JP | 2000-266796 A | 9/2000 |
| JP | 2004-140278 A | 5/2004 |
| JP | 2006-310709 A | 11/2006 |
| JP | 2008-258188 A | 10/2008 |
| JP | 2009-500256 A | 1/2009 |
| JP | 2009-540556 A | 11/2009 |
| JP | WO2013/021645 A1 | 3/2015 |

OTHER PUBLICATIONS

Written Opinion in PCT Application No. PCT/JP2018/036321, dated Dec. 11, 2018, 4pp.
Extended European Search Report in EP Application No. 18865737.3, dated Jun. 4, 2021, 6pp.

* cited by examiner

POD OPENER

RELATED APPLICATIONS

The present application is a continuation of International Application Number PCT/JP2018/036321, filed Sep. 28, 2018, which claims priority from Japanese Application Number 2017-197918, filed Oct. 11, 2017, the disclosures of which applications are hereby incorporated by reference herein in their entirety.

TECHNICAL FIELD

The present invention relates to a substrate transferring operation between various manufacturing processes forming a fine circuit pattern on a surface of a flat substrate such as a semiconductor wafer and a substrate transporting operation in a processing device performing various surface processing for forming a circuit pattern on these substrates. In particular, the invention relates to a container opening and closing device which opens a container storing substrates and allows a transportation robot to be accessible to the substrates stacked in the container and a substrate processing system including the container opening and closing device.

BACKGROUND ART

When transferring a flat substrate such as a semiconductor wafer, a liquid crystal panel, and an organic EL panel between manufacturing processes, the substrate is transferred while being horizontally supported on a shelf formed at a predetermined interval in a storage container. In particular, the semiconductor wafer is transferred while being stored in a hermetic container called a front opening unified pod (FOUP) in many cases. A vertical pitch of the shelves provided in the FOUP is defined by a semiconductor equipment and materials international (SEMI) standard. The vertical pitch is defined as 10 mm in the semiconductor wafer having a diameter of 300 mm and is defined as 12 mm in the semiconductor wafer having a diameter of 450 mm. These are dimensions set in consideration of a wafer holding means provided in a wafer transportation robot or the like when entering between the semiconductor wafers supported by the shelves in order to transport the semiconductor wafers.

In recent years, adhesion of dust to the surface of the semiconductor wafer and unnecessary natural oxide films generated on circuit patterns formed on the surface have become serious problems causing deterioration in product yield as semiconductor circuit line widths have become finer. Therefore, measures have been considered to fill the inside of the FOUP with an inert gas such as nitrogen or to maintain the inside of the container in a vacuum state so as to suppress the adhesion of dust and the formation of a natural oxide film.

As a related art, a substrate loading device shown in Patent Document 1 is known. In addition, the numbers attached to the names of the respective parts in paragraphs [0004] and [0006] are the numbers of the respective parts given in Patent Document 1. FIGS. 1A and 1B are views illustrating a conventional vacuum container 1 and a substrate loading device 2 which allows a transportation robot to transport a substrate by opening the vacuum container 1. This conventional vacuum container 1 includes a bottom cover 11, a cassette 7 which is placed on a placement surface of the bottom cover 11, and a cassette container 10 which surrounds the cassette 7 and engages with the bottom cover 11. The cassette container 10 is placed on a predetermined placement portion 25 of the substrate loading device 2 and after the engagement between the bottom cover 11 and the cassette container 10 is released, the cassette 7 storing the substrate 8 is moved into a cassette chamber 20 by an elevating mechanism 22 provided in the substrate loading device 2. Then, the substrate 8 is transported to a processing device by a transportation means and is subjected to predetermined processing. Next, the substrate 8 subjected to the predetermined processing is returned to the cassette 7 by the transportation means, the cassette 7 and the bottom cover 11 are moved upward by the elevating mechanism, and the cassette container 10 and the bottom cover 11 engage with each other. The container placement surface of the substrate loading device 2 hermetically contacts the lower surface of the cassette container 10. Accordingly, the vacuum atmosphere in the cassette chamber 20 is not damaged by performing the above series of operations.

CITATION LIST

Patent Document

Patent Document 1: JP 2004-140278 A

SUMMARY OF THE INVENTION

Problem to be Solved by the Invention

By using the vacuum container 1 and the substrate loading device 2, the substrate 8 can be transported to each vacuum processing device without being exposed to the atmosphere. Accordingly, troubles such as generation of unnecessary natural oxide films and adhesion of dust on the substrate surface can be reduced. However, since the cassette 7 is formed to have a vertical pitch in which the wafer holding means of the transportation robot transporting the substrate 8 can be inserted, the vertical dimension of the cassette 7 increases. As a result, since the volume of the vacuum container 1 storing the cassette 7 increases, it is required a long time until dropping the pressure to a predetermined vacuum pressure. Further, since the volume increases, the surface area of the vacuum container 1 also increases. Accordingly, it is necessary to thicken the cassette 7 or the bottom cover 11. As a result, the manufacturing cost of the vacuum container 1 increases. Furthermore, since the vacuum container 1 increases in size, the weight of the vacuum container 1 also increases. At present, the vacuum container 1 is transferred between processes by an inter-process transfer means installed in a factory. However, when it is attempted to suppress the weight of the vacuum container 1 to a weight that can be carried by the inter-process transfer means, a large number of substrates 8 cannot be carried.

The invention has been made in view of the above-described problems and an object of the invention is to provide a pod opener which opens a vacuum container accommodating vertically stacked substrate cassettes supporting substrates and is displaceable so that a transportation robot is accessible to the substrate cassettes stored therein and a substrate transportation system at low cost.

Means for Solving Problem

In order to achieve the above-described object, a pod opener of the invention is a pod opener for placing a container, storing cassettes supporting substrates and stacked vertically, at a predetermined position and allowing the substrates supported by the cassettes to be accessible by a substrate holding member of a transportation device, including: an elevating mechanism elevating the stacked cassettes in a vertical direction; a first hook member engaging with an engagement means of the cassette and supporting the cassette; a second hook member engaging with an engagement means of the cassette disposed immediately below the cassette supported by the first hook member and supporting the cassette disposed immediately therebelow; a forward and backward movement mechanism moving the first hook member and the second hook member forward and backward with respect to the cassette; an urging member urging the second hook member upward; and an atmosphere maintaining device maintaining an internal space having the cassette disposed therein in a predetermined atmosphere, in which the second hook member is displaceable with respect to the first hook member.

Further, in the pod opener of the invention, when the second hook member does not engage with the cassette, a vertical pitch between an engagement portion of the first hook member and an engagement portion of the second hook member is substantially the same as a vertical pitch of each engagement means of the stacked cassettes.

With the above-described configuration, since the pod opener is displaceable so that the transportation robot is accessible to the substrate cassettes stored in the vacuum container while the substrate cassettes supporting the substrates are stacked in the vertical direction, it is possible to store the stacked cassettes in the vacuum container and to decrease the vertical dimension of the vacuum container as much as possible. Further, since only a predetermined cassette is supported by the first and second hook members so that the substrate holding member can access the cassette, the other cassettes are just in a stacked state. Accordingly, since it is possible to decrease the volume of the space storing the cassette of the pod opener, it is possible to decrease the dimension of the pod opener. Further, since it is possible to decrease the dimension of the elevating mechanism or other members, it is possible to reduce manufacturing cost and to provide the pod opener at low cost.

Further, the urging member of the pod opener of the invention may be an elastic body such as a torsion spring or a coil spring. With the above-described configuration, the pod opener can be provided at low cost with a simple structure. Further, a weight may be provided instead of the elastic body. Since the weight is disposed on the side opposite to a portion supporting the cassette by the second hook member with respect to the shaft serving as a fulcrum in the second hook member, it is possible to maintain a horizontal state by bringing the second support member closer the first support member when the load of the cassette is not applied to the second support member and moving the second support member away from the first support member when the load of the cassette is applied to the second support member. Further, it is possible to combine different types of urging members as a combination of a weight and a torsion spring and a combination of a weight and a coil spring and to provide that combination in a single second support member.

Further, a substrate processing system of the invention includes: the pod opener; a vacuum transportation robot transporting the substrate; a vacuum transportation device including a vacuum maintaining means storing the vacuum transportation robot in an internal space and maintaining the internal space in a vacuum state; and a processing device performing various processes on the substrate.

Further, an atmospheric transportation system of the invention includes: the pod opener; an atmospheric transportation robot transporting the substrate; an atmospheric transportation chamber including an inert gas supply means storing the atmospheric transportation robot in an internal space and maintaining the internal space in an inert gas atmosphere; and a load port fixed to the atmospheric transportation chamber, in which the pod opener and the atmospheric transportation chamber are connected to each other through a gate valve, and in which the pod opener includes a vacuum maintaining means maintaining the internal space in a vacuum state and a inert gas maintaining means.

Effect of the Invention

According to the above-described configuration, it is possible to provide an inexpensive pod opener having a small and simple structure.

MODE(S) FOR CARRYING OUT THE INVENTION

Figure 1A:
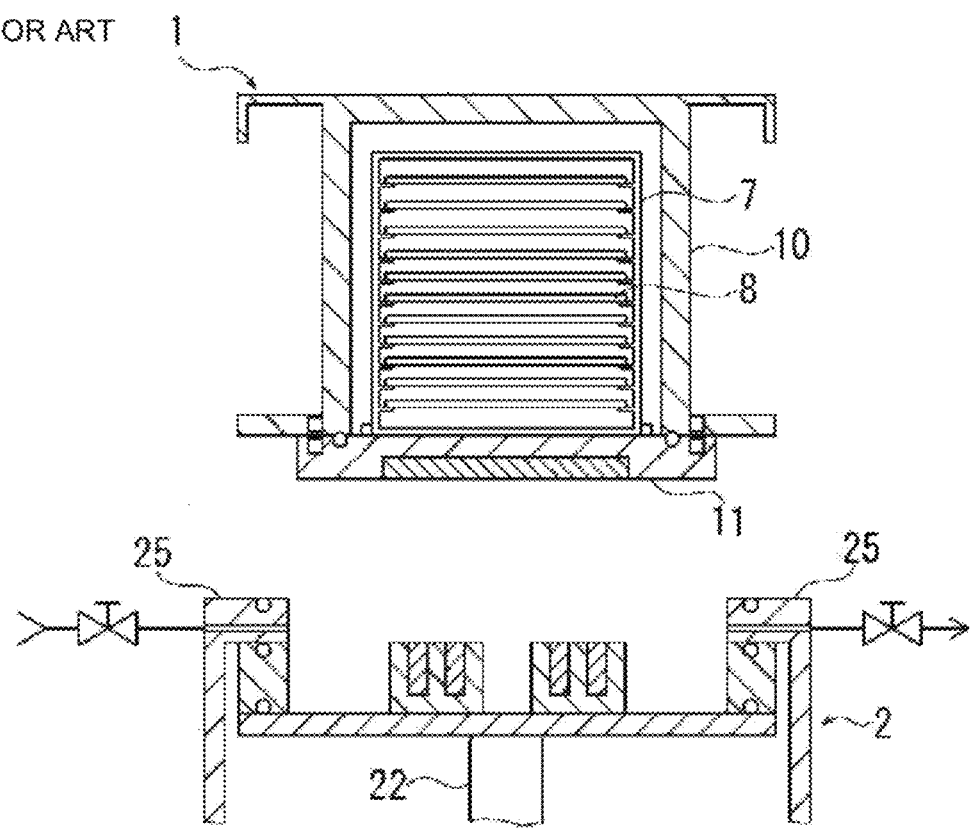
FIGS. 1A and 1B are views illustrating a vacuum container and a substrate loading device of the related art.
Figure 1B:
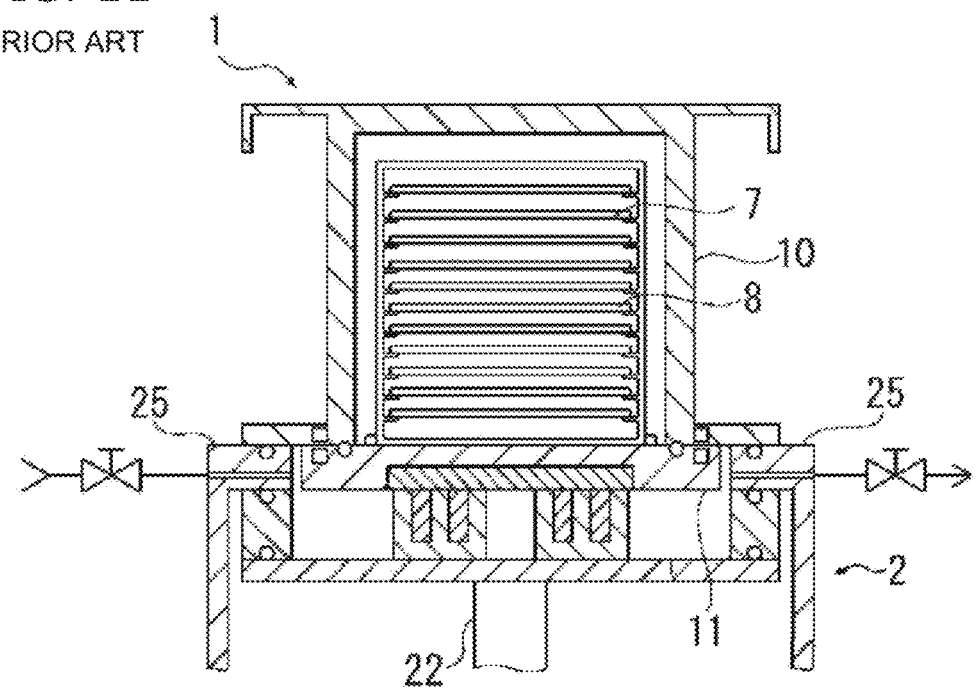
Figure 2:
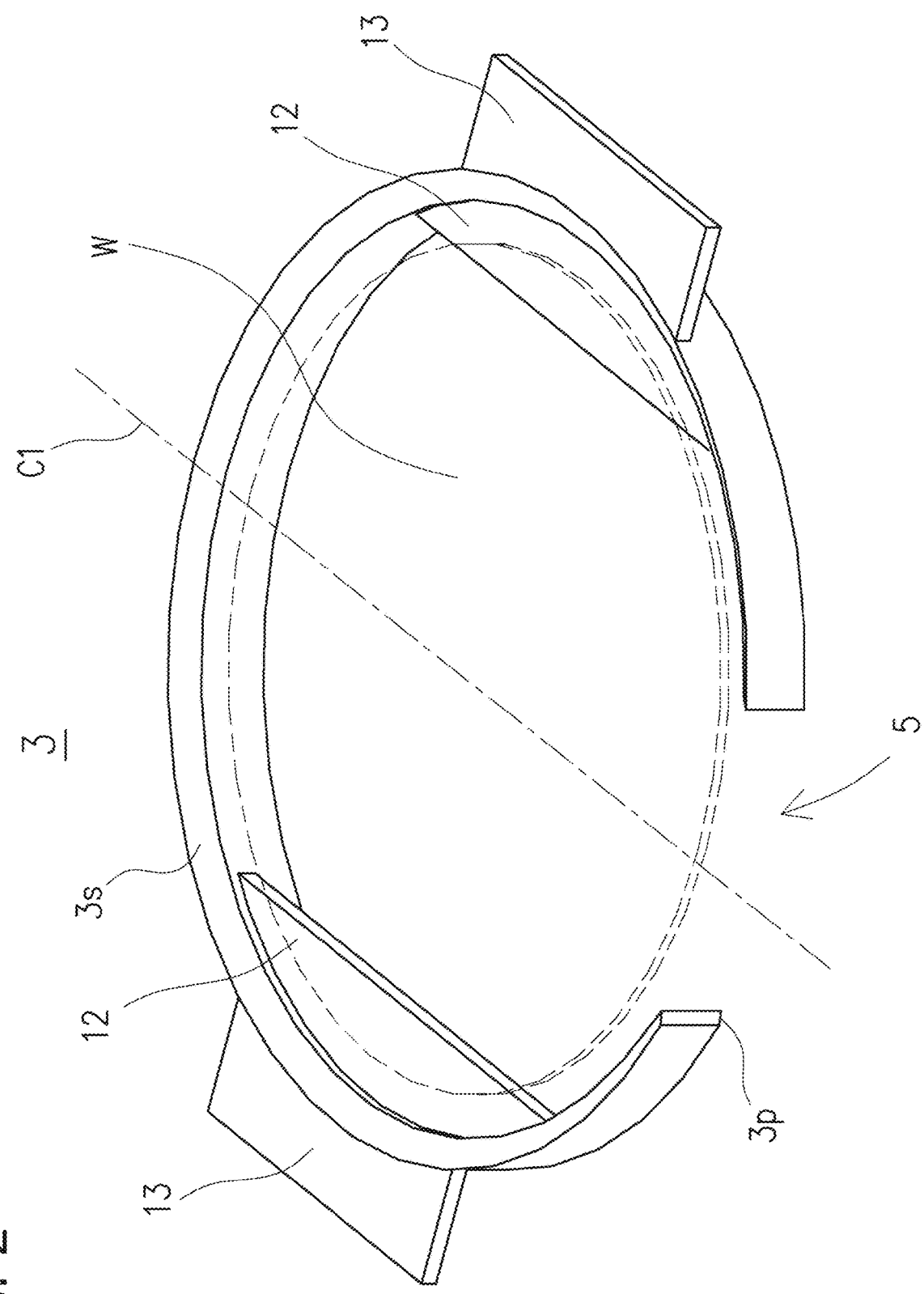
FIG. 2 is a view illustrating a cassette according to an embodiment of the invention.
Figure 3:
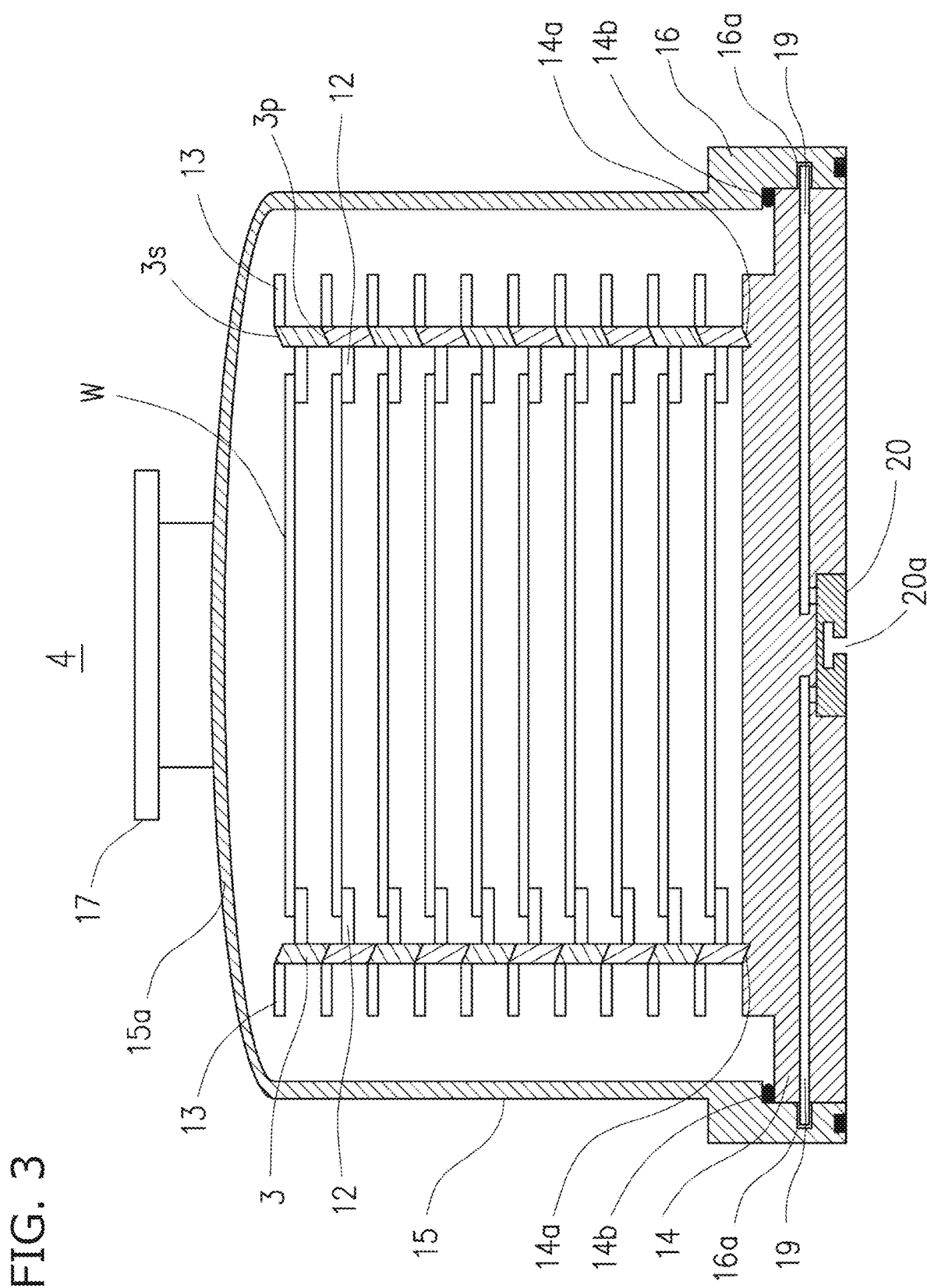
FIG. 3 is a view illustrating a cassette and a storage container according to the embodiment of the invention.
Figure 4:
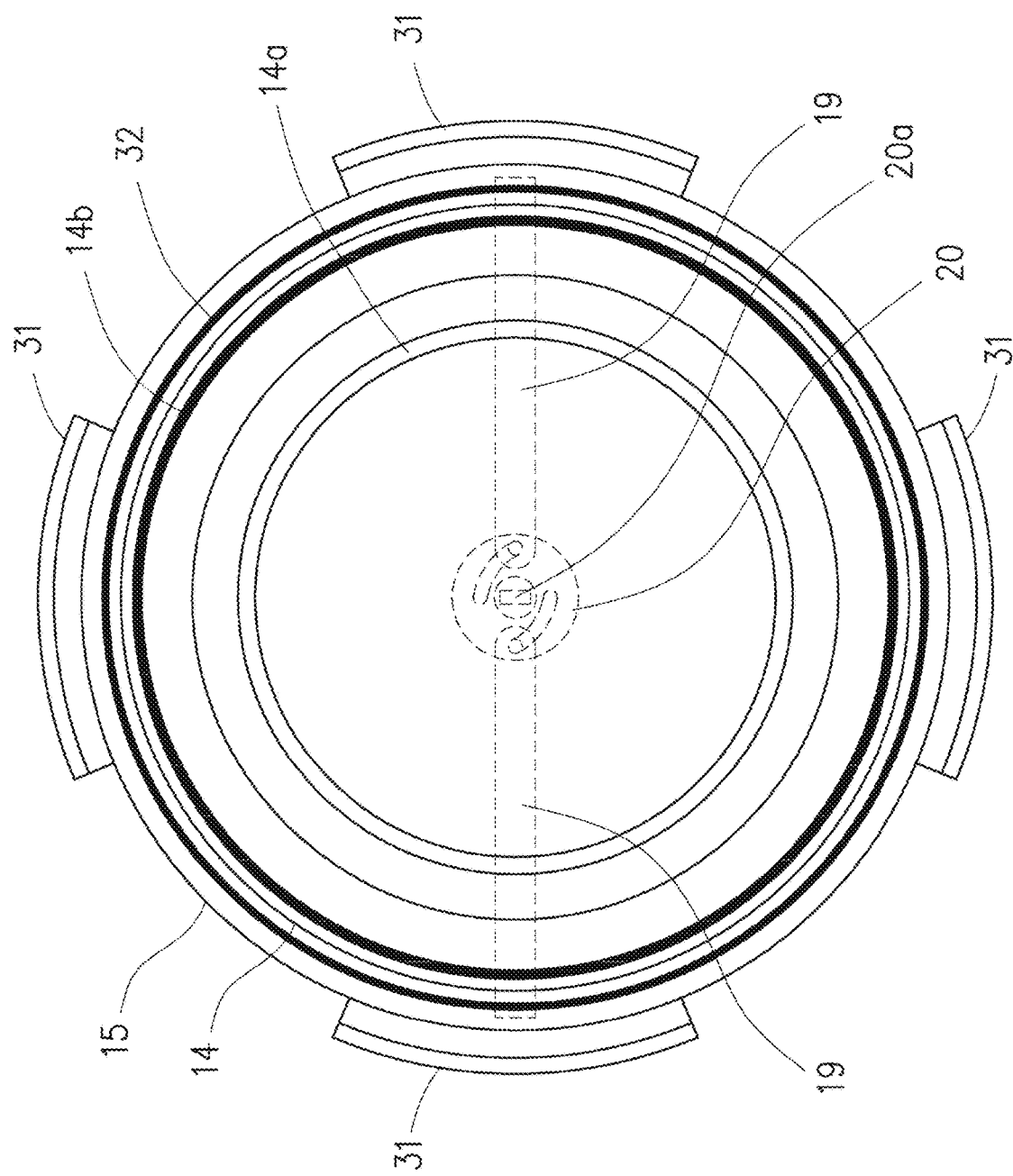
FIG. 4 is a view illustrating a bottom plate according to the embodiment of the invention when viewed from above.

Hereinafter, an embodiment of the invention will be described in detail with reference to the drawings. FIG. 2 is a view illustrating a cassette 3 which supports a substrate and is disposed so as to be stacked vertically and FIG. 3 is a view illustrating the stacked cassettes 3 and a storage container 4 which stores the cassettes 3 in a sealed state. Further, FIG. 4 is a view illustrating a bottom plate 14 of the storage container 4 when viewed from above. Additionally, the substrate used in this embodiment is a semiconductor wafer W and the storage container 4 is a vacuum pod that can maintain the inside of the container in a vacuum state. Hereinafter, the storage container 4 will be appropriately referred to as the "vacuum pod 4".

The cassette 3 of this embodiment is a member that places the wafer W thereon and is substantially formed in a C-shape in which a part of a cylindrical member is cut. This notched region 5 has a gap through which a finger 9 corresponding to a substrate holding member of a vacuum transportation robot 6 to be described later can pass. Further, support plates 12 which support the wafer W are disposed in the inner peripheral surface of the cassette 3 so as to be located at symmetrical positions with respect to a center line Cl passing through the center portion of the region 5 and the center of the cassette 3 and extending in the horizontal direction. Further, a slope (taper) 3p is formed at the lower end portion of the cassette 3 so that the diameter decreases from the outer side surface toward the inner side surface as it goes downward. Further, a slope (taper) 3s is formed at the upper end portion of the cassette 3 so that the diameter decreases from the outer side surface toward the inner side surface as it goes downward. Accordingly, when the plurality of cassettes 3 are stacked, the upper taper 3s and the lower taper 3p of the cassettes 3 are fitted to each other so as to be positioned at a predetermined position.

The cassette 3 of this embodiment has a size in which the wafer W having a diameter of 300 mm can be stored therein and a vertical height dimension is formed as 4 mm. According to the SEMI standard which is an international standard for a semiconductor manufacturing device, a front opening unified pod (FOUP) for storing the wafer W is specified to have a wafer storage pitch of 10 mm. Accordingly, when the cassette 3 of this embodiment is used, the volume can be reduced by about 60% compared to the case of using the FOUP. Further, a wafer placement surface of the support plate 12 is provided with a recess which matches the shape of the wafer W and the wafer W has a structure in which the wafer is placed at a predetermined position of the support plate 12.

Figure 12A:
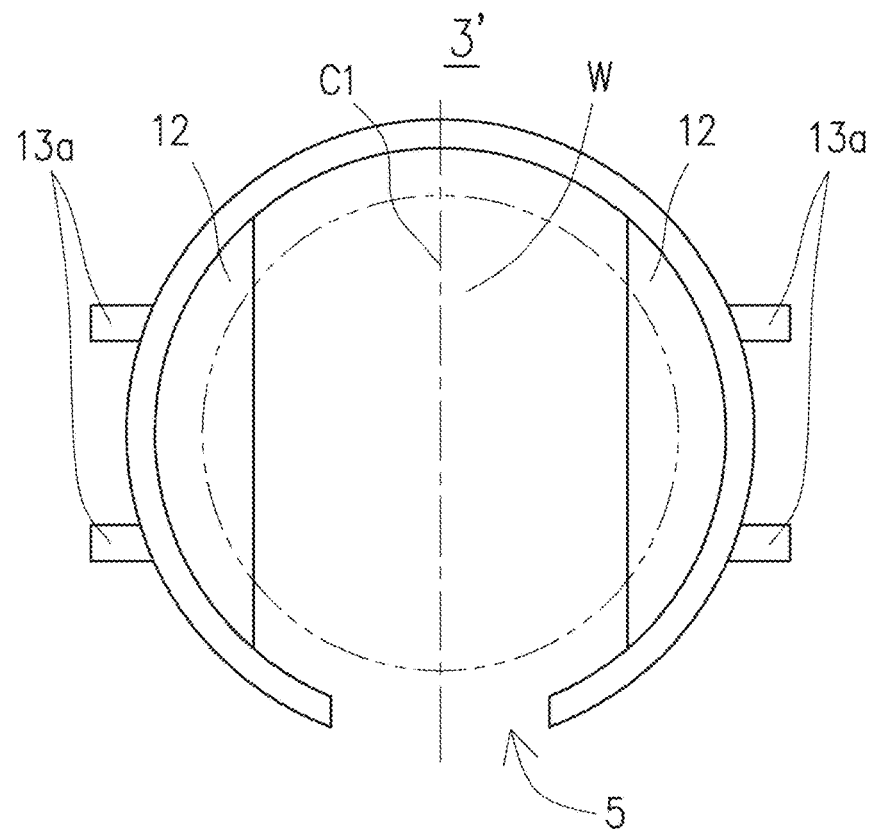
FIGS. 12A and 12B are views illustrating a cassette according to another embodiment of the invention.
Figure 12B:
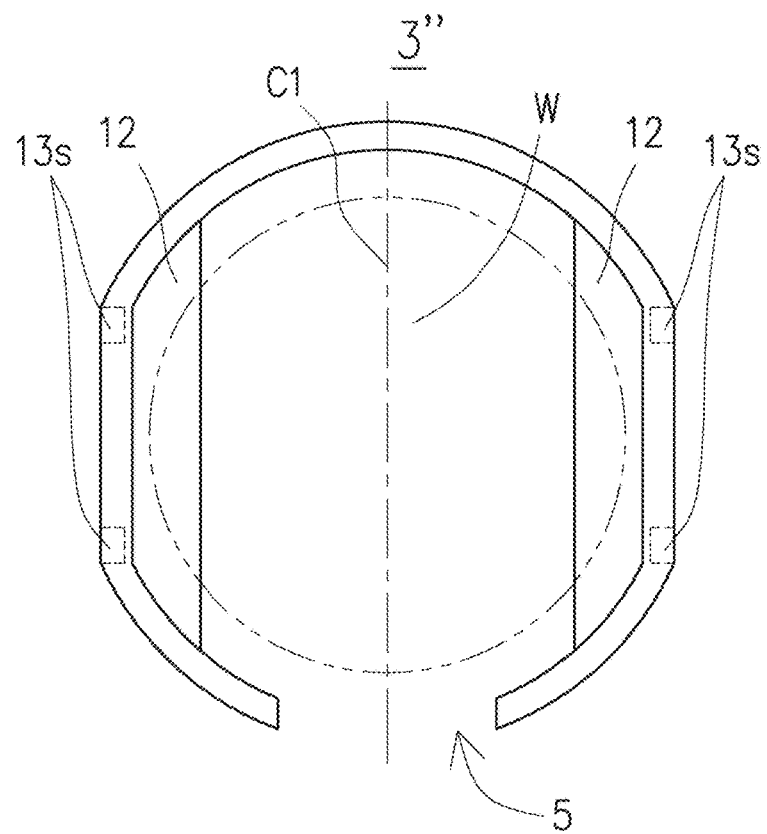

Engagement members 13 which engage with first and second hook members 41 and 42 of a pod opener 30 to be described later are disposed in the outer peripheral surface of the cassette 3 of this embodiment so as to be located at symmetrical positions with respect to the center line Cl. Additionally, in this embodiment, the engagement member 13 is provided at each of the left and right sides so as to protrude from the outer peripheral surface of the cassette 3. In addition, two engagement members 13a may be provided at each of the left and right sides of a cassette 3' (see FIG. 12A). Further, instead of the engagement members 13 and 13a, an engagement hole 13s which is an engagement means engaging with each of the hook members 41 and 42 may be punched in the outer periphery of a cassette 3" (see FIG. 12B). Further, the cassette 3 of this embodiment is formed of a resin material such as PEEK material (polyetheretherketone) or polycarbonate, but the invention is not limited thereto. For example, the cassette can be made of metal such as aluminum or stainless steel.

Next, the storage container 4 which stores the cassette 3 will be described. The storage container 4 of this embodiment is the vacuum pod 4 having a structure capable of maintaining the inside in a vacuum state and has a volume capable of storing ten cassettes 3 stacked vertically. The vacuum pod 4 of this embodiment includes a bottom plate 14 which places the cassette 3 at a predetermined position and a casing 15 which covers the cassettes 3 of 10 stages placed on the bottom plate 14 and is hermetically fitted to the bottom plate 14.

The casing 15 is formed in a substantially cylindrical shape and the lower end portion is provided with an opening portion which is hermetically fittable to the bottom plate 14. Further, the upper portion of the casing 15 is hermetically closed by a dome-shaped lid member 15a. The opening portion has a diameter in which the cassette 3 disposed horizontally can pass and the peripheral edge of the opening portion is provided with a flange portion 16 which protrudes in the radial direction. An engagement hole 16a which engages with an engagement plate 19 of the bottom plate 14 is punched in the flange portion 16 at a predetermined interval. Further, the lid member 15a is provided with a top flange 17 which protrudes upward. The top flange 17 has a shape corresponding to gripping means provided in an overhead traveling vehicle of over head transport (OHT) which is a transportation facility in a clean room and the vacuum pod 4 is transferred to a predetermined position in the clean room while the top flange 17 is gripped by the overhead traveling vehicle. Further, an annular seal member 32 which contacts a surface of a pod stage 18 and hermetically closes the atmosphere inside and outside the vacuum pod 4 is fixed to a surface facing the pod stage 18 in the casing 15.

The casing 15 of this embodiment is formed of transparent polycarbonate for weight reduction, but may be formed of a metal material such as aluminum, stainless steel, or titanium, glass, or the like. Further, when the casing is formed of a metal material, a window for observing the inside state can be provided and a transparent resin material or a glass material can be used for a member closing the window.

The bottom plate 14 of the vacuum pod 4 is a substantially columnar box-shaped member, a positioning groove 14a for guiding the cassette 3 to a predetermined position is provided in an upper surface thereof, and an annular seal member 14b which hermetically closes a gap between the bottom plate 14 and the casing 15 is fixed to the peripheral edge portion thereof. The positioning groove 14a is a groove having a substantially V-shaped cross-section and has a shape corresponding to the taper formed in the lower surface of the cassette 3. Additionally, a region in which the cassette 3 is placed on the upper surface of the bottom plate 14 has a shape protruding upward in relation to the periphery. This is because the interference between the bottom plate 14 and a cassette support mechanism 40 to be described later needs to be avoided when the cassette support mechanism 40 engages with the cassette 3 at the lowest stage. Further, an engagement mechanism which engages with the casing 15 is provided inside the bottom plate 14. The engagement mechanism of the bottom plate 14 of this embodiment includes an engagement plate 19 which is disposed so as to protrude upward and downward with respect to the engagement hole 16a punched in the flange portion 16 of the casing 15 and a locking member 20 which allows the engagement plate 19 to protrude upward and downward. The locking member 20 is provided with a rectangular key groove 20a which is formed in a surface facing the stage door 29 in the pod stage 18 and a key member 18a provided in the stage door 29 to be described later is inserted into the key groove 20a. When the key member 18a rotates in a predetermined direction, the locking member 20 also rotates and the engagement plate 19 protrudes upward and downward with respect to the engagement hole 16a in synchronization with this rotation operation. Accordingly, a structure capable of switching an engagement state and a disengagement state is obtained. Further, when the key member 18a is rotated in a predetermined direction, the engagement between the casing 15 and the bottom plate 14 is released and the bottom plate 14 and the stage door 29 engage with each other. Further, when the key member 18a is rotated in the opposite direction, the engagement between the bottom plate 14 and the stage door 29 is released and the casing 15 and the bottom plate 14 engage with each other.

The bottom plate 14 of this embodiment is formed of transparent polycarbonate, but can be also formed of, for example, a metal material such as aluminum, stainless steel, or titanium, glass, or the like. Further, a member surrounding the outer periphery of the bottom plate 14 can be formed of a metal material and an engagement mechanism disposed at the inside can be formed of a resin material such as polycarbonate or PEEK material. Further, the bottom plate 14 of this embodiment may include a check valve which sucks a gas remaining inside the vacuum pod 4 so as to be maintained at a predetermined vacuum pressure. Since the check valve is provided, when the internal pressure of the vacuum pod 4 becomes higher than a predetermined vacuum pressure during the transportation operation, the internal atmosphere of the vacuum pod 4 is sucked by a pump or the like to be returned to a predetermined vacuum pressure. Further, a relief valve for returning the internal pressure of the vacuum pod 4 maintained in a vacuum state to the atmospheric pressure may be provided. Since the relief valve is provided, it is possible to manually open the vacuum pod 4 without using the pod opener 30 when it is necessary to open the vacuum pod 4.

Figure 5:
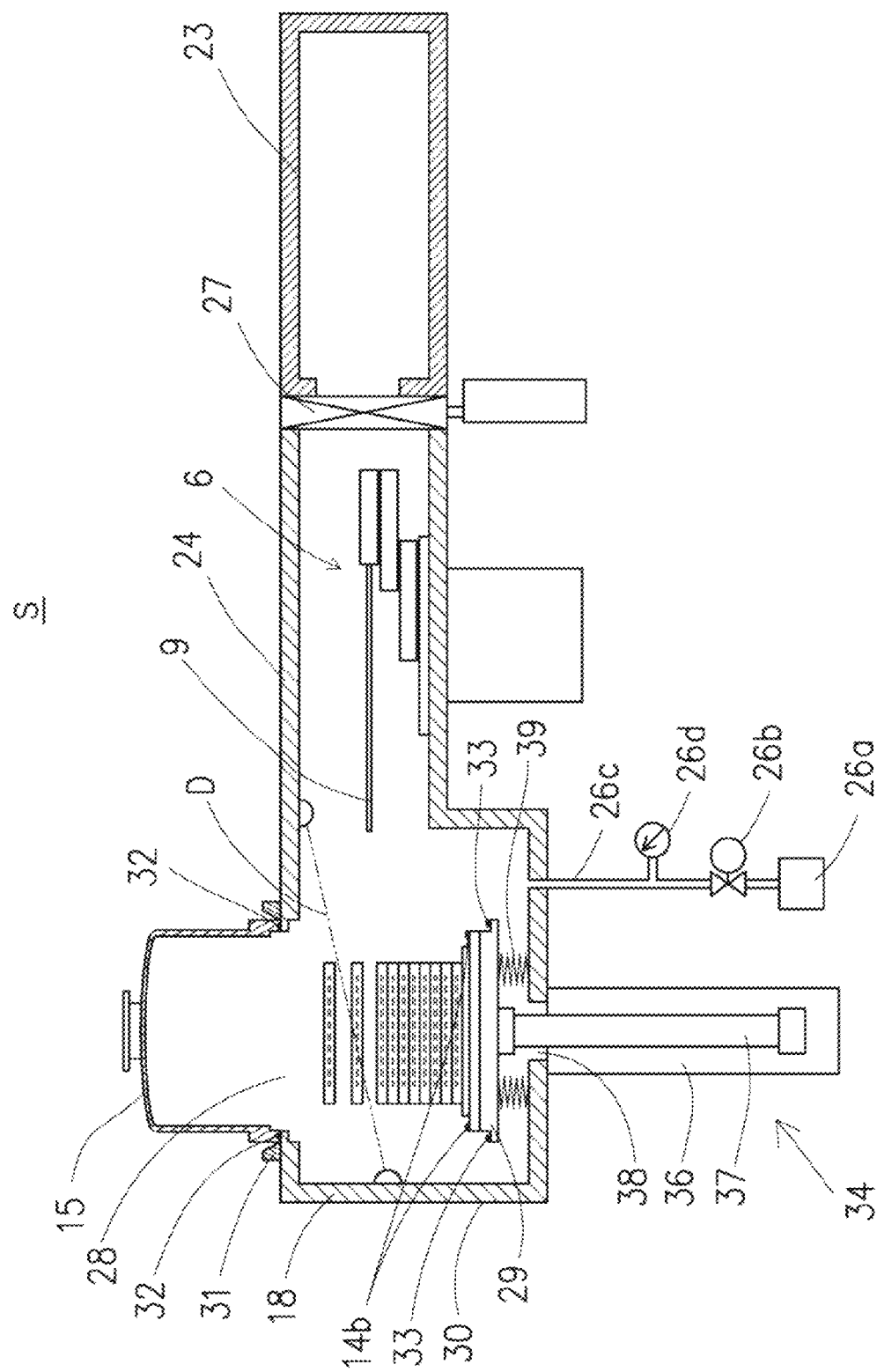
FIG. 5 is a cross-sectional view illustrating a wafer processing system S including a pod opener according to the embodiment of the invention.
Figure 6:
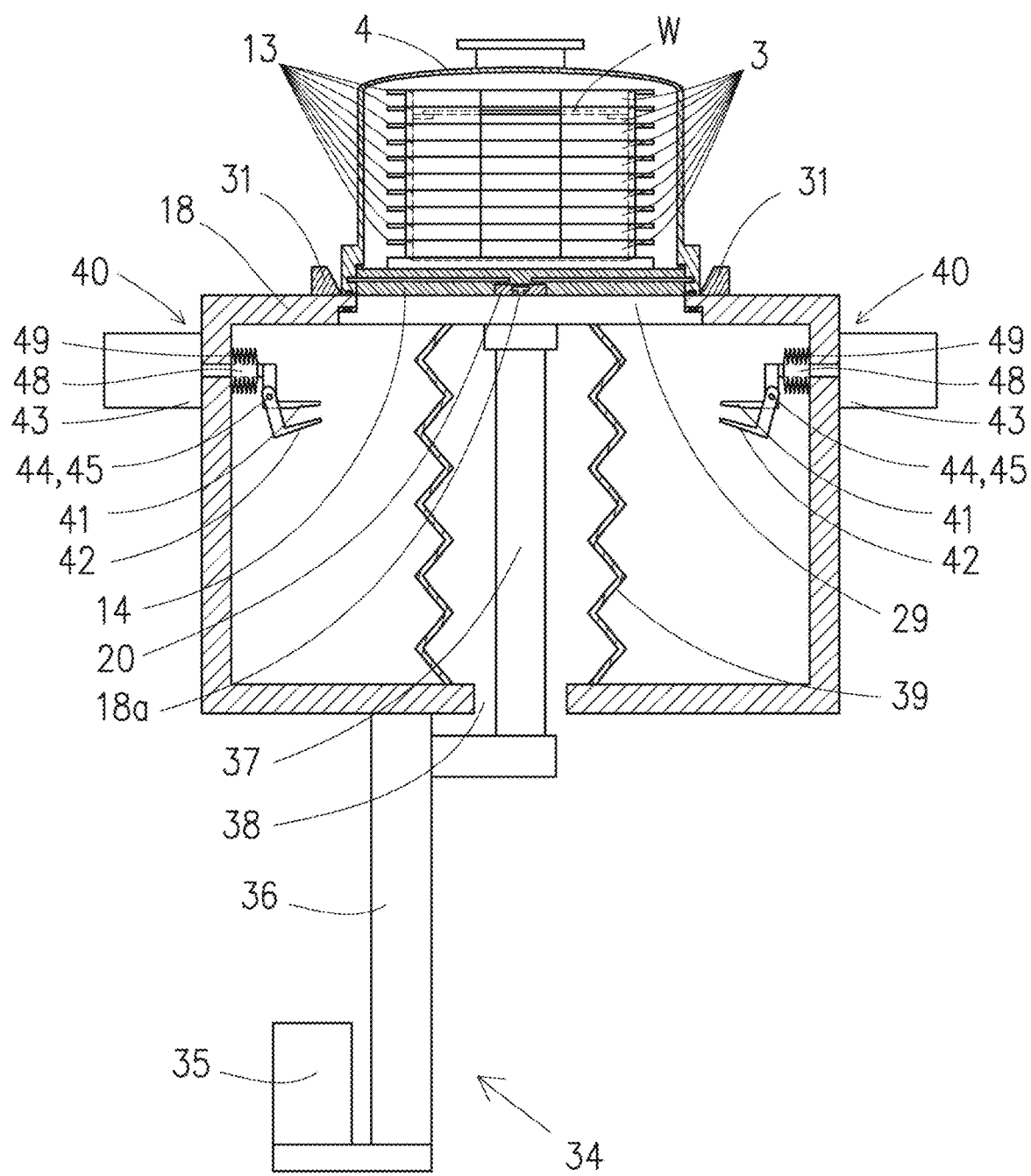
FIG. 6 is a cross-sectional view illustrating the pod opener of this embodiment when viewed from a side in which a vacuum transportation robot is disposed.
Figure 7A:
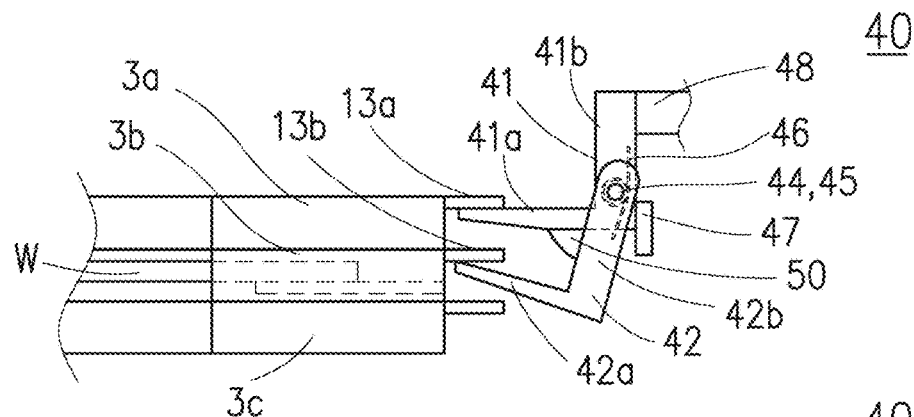
FIGS. 7A to 7D are views illustrating an outline of a cassette support mechanism according to the embodiment of the invention.
Figure 7B:
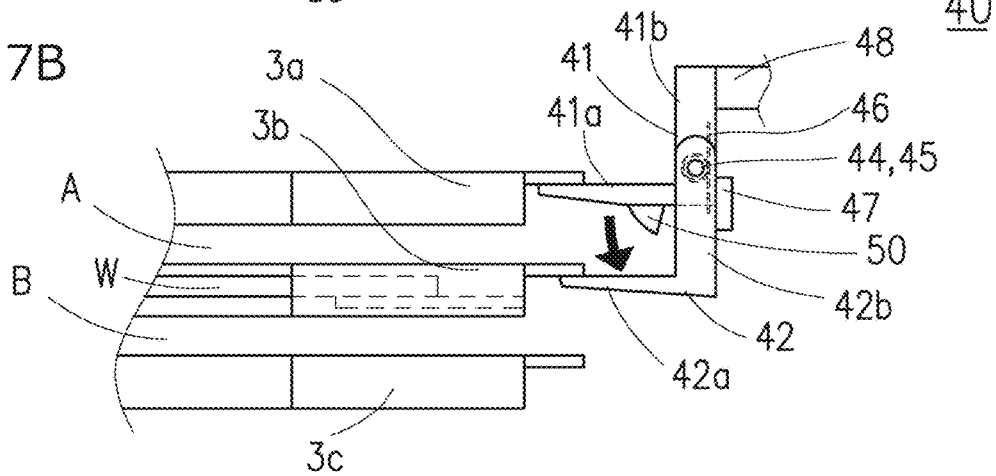
Figure 7C:
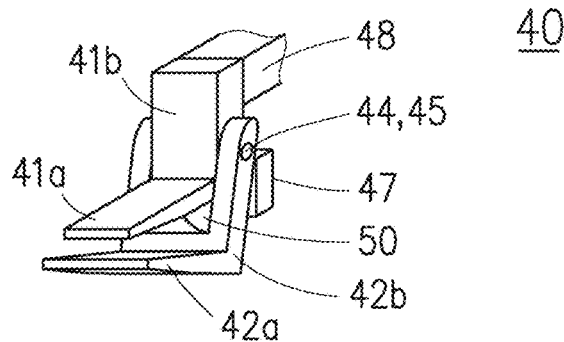
Figure 7D:
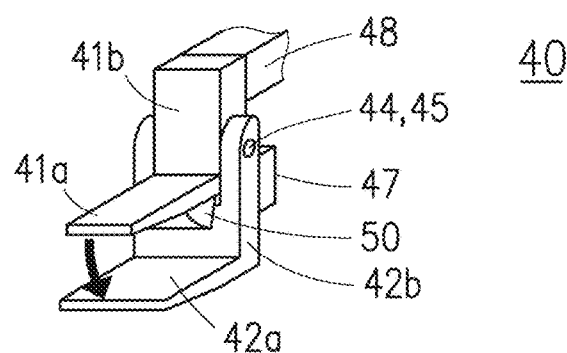

Next, the pod opener 30 which opens the vacuum pod 4 so that the stored cassette 3 can be accessed by the vacuum transportation robot 6 will be described. FIG. 5 is a cross-sectional view illustrating a wafer processing system S including the pod opener 30 according to the embodiment of the invention and FIG. 6 is a cross-sectional view illustrating the pod opener 30 of this embodiment when viewed from a side in which the vacuum transportation robot 6 is disposed. Additionally, the cassette support mechanism 40 which exists originally is omitted in FIG. 5 in order to avoid the complicated drawing. The wafer processing system S of this embodiment includes a processing device 23 which performs various processing such as CVD or etching on the surface of the wafer inside a vacuum atmosphere, the vacuum transportation robot 6 which accesses the cassette 3 inside the vacuum atmosphere and performs a transportation operation between the cassette 3 and the processing device 23, a vacuum transportation chamber 24 which stores the vacuum transportation robot 6 and forms a space to be maintained in the vacuum atmosphere, and the pod opener 30 which opens or closes the vacuum pod 4 and allows the stored cassette 3 to be transferred by the vacuum transportation robot 6. Here, the access means an operation in which the vacuum transportation robot 6 holds the wafer W placed on the cassette 3 by the finger 9 and unloads the wafer toward the processing device 23 and an operation in which the vacuum transportation robot 6 delivers the wafer W transported from the processing device 23 to a predetermined position on the empty cassette 3.

An internal space is maintained in the vacuum atmosphere by a vacuum atmosphere maintaining device provided in each of the processing device 23, the vacuum transportation chamber 24, and the pod opener 30. Further, the processing device 23 and the vacuum transportation chamber 24 are connected to each other through a gate valve 27. The gate valve 27 is a member that can switch the internal atmosphere of the processing device 23 and the vacuum transportation chamber 24 between an open state and a closed state. When the gate valve 27 is closed, a gas supplied into the processing device 23 is prevented from entering the internal space of the vacuum transportation chamber 24 or the pod opener 30. Further, when the gate valve 27 is opened, that is, the processing device 23 and the vacuum transportation chamber 24 communicate with each other, the vacuum transportation robot 6 can transport the wafer W with respect to the processing device 23. Additionally, the vacuum transportation robot 6 of the wafer processing system S of this embodiment includes the finger 9 which holds the wafer W from below, an arm body which has the finger 9 provided at a front end and moves the finger 9 forward and backward by bending and stretching operations, a turning portion which supports the arm body and turns the arm body within a horizontal plane, an elevating portion which elevates the turning portion up and down, and a drive source which individually drives these mechanisms. This configuration is generally known. Further, the wafer processing system S of this embodiment is provided with a transmitted light sensor determining whether the wafer W is placed on the cassette 3. The transmitted light sensor determines that the wafer W does not exist on the cassette 3 when an optical axis D emitted from a light emitter is detected by a light receiver and determines that the wafer W exists on the cassette 3 when the optical axis D is interrupted by the wafer W so that the light receiver does not detect the optical axis D. Accordingly, since it is possible to detect whether the wafer W exists on the cassette 3, it is possible to prevent an erroneous operation of the vacuum transportation robot 6.

The pod opener 30 according to the embodiment of the invention substantially has a box shape and the internal space of the pod opener 30 communicates with the internal space of the vacuum transportation chamber 24. The pod opener 30 of this embodiment is provided with a vacuum pump 26a and a control valve 26b which serve as a vacuum atmosphere maintaining device and the vacuum pump 26a and the control valve 26b are connected to the internal space of the pod opener 30 through a pipe 26c. Further, a pressure sensor 26d which measures a vacuum pressure inside the pod opener 30 is connected to the inside of the pod opener 30 through the pipe 26c. Further, the upper surface of the pod opener 30 of this embodiment is provided with the pod stage 18 which places the vacuum pod 4 therein and is provided with a circular opening 28. This opening 28 can be hermetically closed from the inside by the stage door 29 having a disk shape. With the above-described configuration, the internal space of the pod opener 30 and the internal space of the vacuum transportation chamber 24 can be maintained at a predetermined vacuum pressure atmosphere. Additionally, although the pod opener 30 of this embodiment includes the vacuum atmosphere maintaining device maintaining the internal space in a vacuum state, the invention is not limited thereto, and the pod opener may include an inert gas atmosphere maintaining device which maintains the internal space in an inert gas atmosphere such as a nitrogen gas or an argon gas or may be configured to maintain the internal space in a predetermined atmosphere other than the description above.

A positioning member 31 that guides the placed vacuum pod 4 to a predetermined position is disposed in the pod stage 18 of the upper surface of the pod opener 30 at a predetermined interval in the peripheral edge of the opening 28. Further, when the vacuum pod 4 is placed on the pod stage 18, the seal member 32 fixed to the bottom portion of the casing 15 of the vacuum pod 4 hermetically contacts the upper surface of the pod stage 18 so that the inside of the pod opener 30 is maintained in a vacuum state. Additionally, the pod opener 30 of this embodiment may be provided with a fixing member that fixes the vacuum pod 4 to the placement surface of the pod stage 18 in order to fix the placed vacuum pod 4.

The opening 28 is a passage hole of the bottom plate 14 and the cassette 3 separated from the casing 15 and has a diameter which is larger than the diameter of the bottom plate 14 and smaller than the diameter of the bottom surface of the casing 15. This opening 28 is hermetically closed from the internal space of the pod opener 30 by the disk-shaped stage door 29. An annular seal member 33 for hermetically closing the opening 28 is fixed to a surface contacting the peripheral edge of the opening 28 of the stage door 29.

The stage door 29 is vertically elevated up and down in the internal space of the pod opener 30 by an elevating mechanism 34 of the pod opener 30. The elevating mechanism 34 includes a stepping motor 35 which is a drive source and a guide means 36 for converting the rotation operation of the output shaft of the stepping motor 35 into the vertical elevating movement of the stage door 29. Here, the rotation operation of the stepping motor 35 is transmitted to a feeding screw constituting the guide means 36 through a pulley and a toothed belt (not illustrated) so that a movable piece provided in the feeding screw and an elevating shaft 37 fixed to the movable piece are elevated up and down. Further, a guide rail (not illustrated) of the guide means 36 guides the elevating shaft 37 in the vertical movement direction. The elevating shaft 37 is disposed so as to penetrate the opening 38 formed in the bottom surface of the pod opener 30 and the stage door 29 is fixed to the upper surface of the elevating shaft 37. With the above-described configuration, the stage door 29 can be elevated to a predetermined position by the operation of the stepping motor 35.

The stage door 29 is provided with the key member 18a substantially having a T-shape. When the key member 18a engages with the key groove 20a of the locking member 20 disposed in the bottom plate 14 and rotates in a predetermined direction, the engagement state and the disengagement state between the casing 15 and the bottom plate 14 can be switched. In the pod opener 30 of this embodiment, the stepping motor is used as the drive source for rotating the key member 18a and this stepping motor is stored in the elevating shaft 37. The stepping motor 35 of the elevating mechanism 34 and the stepping motor of the engagement mechanism are electrically connected to a control unit (not illustrated) of the pod opener 30 and the operation is controlled by the control unit.

Further, the lower end of the bellows 39 corresponding to the vacuum atmosphere is hermetically attached to the bottom surface inside the pod opener 30. The upper end of the bellows 39 is hermetically attached to the lower surface of the stage door 29. Accordingly, the stage door 29 can be elevated upward and downward inside the pod opener 30 even in a state in which the internal space of the pod opener 30 is maintained in a vacuum state.

Next, the cassette support mechanism 40 of the pod opener 30 according to the embodiment of the invention will be described. FIGS. 7A to 7D are views illustrating an outline of the cassette support mechanism 40 according to the embodiment of the invention. In the following description, when the cassettes 3, 3', and 3" have a specific positional relationship, they are respectively referred to as cassettes 3a, 3b, and 3c. The cassette support mechanism 40 of this embodiment includes the first hook member 41 that engages with the engagement member 13a of a predetermined cassette 3a among the cassettes 3 moving downward in a stacked state and supports the cassette 3a, the second hook member 42 that is provided so as to be displaceable with respect to the first hook member 41 and is supported by the first hook member 41, and a forward and backward movement mechanism 43 which supports the first hook member 41 and the second hook member 42 and moves the hook members forward and backward with respect to the cassette 3.

Each of the hook members 41 and 42 of this embodiment substantially has an L-shape and supports the cassette 3 in the vertical direction without dropping the cassette in such a manner that the engagement portions 41a and 42a extending in the horizontal direction engage with the engagement members 13 of the predetermined cassette 3. The vertical dimension of each of the engagement portions 41a and 42a is set to be smaller than the vertical pitch of the engagement member 13 of each of the cassettes 3 disposed in a stacked state. Additionally, since the cassettes 3 are disposed so as to be stacked vertically, the first hook member 41 supporting the cassette 3 to be engaged and all the cassettes 3 arranged on the cassette 3 needs to support a larger load. Accordingly, the first hook member 41 is formed so as to have rigidity higher than that of the second hook member 42. Further, the first hook member 41 is fixed to the front end portion of the forward and backward movement mechanism 43 and the second hook member 42 is supported by the first hook member 41 so as to be displaceable with respect to the first hook member 41. Furthermore, a hole 44 is formed in the horizontal direction at each of the column portions 41b and 42b extending in the vertical direction of the first hook member 41 and the second hook member 42 of this embodiment and a shaft 45 is inserted into the horizontal hole 44. When the second hook member 42 swings around the shaft 45 serving as a fulcrum, the position with respect to the first hook member 41 can be changed.

Further, a torsion spring 46 which is an elastic body is stretched between the first hook member 41 and the second hook member 42 of this embodiment. This torsion spring 46 urges the second hook member 42 around the shaft 45 serving as a fulcrum in the clockwise rotation direction of the drawing. The second hook member 42 urged by the torsion spring 46 rotates around the shaft 45 serving as a fulcrum in a direction moving closer to the first hook member 41, but comes into contact with a stopper 50 provided at the lower portion of the engagement portion 41a of the first hook member 41 so that the clockwise (upward) rotation of the second hook member 42 is regulated. When the second hook member 42 comes into contact with the stopper 50, the vertical pitch between the front end portion of the engagement portion 41a of the first hook member 41 and the front end portion of the engagement portion 42a of the second hook member 42 is substantially the same as the vertical pitch between the engagement members 13 of the cassettes 3 disposed in a stacked state. Accordingly, the first hook member 41 and the second hook member 42 can enter between the engagement members 13. That is, in the cassettes 3 disposed in a stacked state, the first hook member 41 can enter between a predetermined cassette 3a and the cassette 3b disposed immediately therebelow and the second hook member 42 can enter between the cassette 3b and the cassette 3c disposed immediately therebelow.

Further, the column portion 41b of the first hook member 41 is provided with a stopper 47. This is for regulating the counter-clockwise (downward) rotation in the drawing of the second hook member 42 around the shaft 45 serving as a fulcrum when a load of the cassette 3 is applied to the engagement portion 42a of the second hook member 42. The position of the second hook member 42 when coming into contact with the stopper 47 is a position in which the upper surface of the engagement portion 42a engaging with the cassette 3b becomes horizontal. Accordingly, the second hook member 42 can support the cassette 3b by the engagement portion 42a while being separated from the cassette 3a supported by the first hook member 41 by a predetermined gap A (see FIG. 7B).

Further, the torsion spring 46 used in this embodiment is set to have an urging force sufficient to rotate the second hook member 42 in the clockwise rotation direction toward the first hook member 41 when no load is applied to the second hook member 42. Further, the urging force of the torsion spring 46 is set to a degree that the load applied to the second hook member 42 cannot be supported when the load of the cassette 3 is applied to the second hook member 42. By the urging force set to the torsion spring 46, the second hook member 42 can take a posture in which the engagement portion 42a is close to the engagement portion 41a of the first hook member 41 when no load is applied to the engagement portion 42a.

When a predetermined cassette 3a among the stacked cassettes 3 is supported by the first hook member 41 and the cassette 3b immediately below the cassette 3a supported by the first hook member 41 is supported by the second hook member 42, the gap A through which the finger 9 of the vacuum transportation robot 6 can pass is formed between the cassette 3a and the cassette 3b. Further, when the elevating mechanism 34 is operated to move down so that the cassette 3 disposed below the cassette 3b supported by the second hook member 42 moves down, a gap B through which the finger 9 of the vacuum transportation robot 6 can pass is formed between the cassette 3b and the cassette 3c disposed immediately below the cassette 3b. Accordingly, the vacuum transportation robot 6 can access the cassette 3b such that the wafer W held by the finger 9 is placed on the cassette 3b or the wafer W placed on the cassette 3b is lifted and transported to the processing device 23.

Next, the forward and backward movement mechanism 43 which moves the first hook member 41 and the second hook member 42 forward and backward with respect to the cassette 3 will be described with reference to FIG. 6. The forward and backward movement mechanism 43 of this embodiment uses a known air cylinder as a drive source for moving the hook members 41 and 42 forward and backward. The air cylinder (the forward and backward movement mechanism 43) controls the supply of air fed from a supply source (not illustrated) through a tube so as to move the piston rod 48 forward and backward with respect to the cassette 3. The column portion 41b of the first hook member 41 is fixed to the front end of the piston rod 48. Accordingly, the first hook member 41 and the second hook member 42 can move in a reciprocating manner with respect to the cassette 3 by the operation of the air cylinder. Additionally, the drive source is not limited to the air cylinder. For example, a hydraulic cylinder, a known stepping motor, or an actuator can be sufficiently used. Further, the operation of the air cylinder is controlled by a control unit (not illustrated).

One end of a bellows 49 corresponding to a vacuum pressure is hermetically fixed to the front end of the piston rod 48. Further, the other end of the bellows 49 is hermetically fixed to the inner wall of the pod opener 30. Accordingly, the air cylinder and the piston rod 48 are isolated from the internal atmosphere of the pod opener 30 so that the vacuum atmosphere inside the pod opener 30 is maintained. Further, it is possible to prevent dust generated by the reciprocating movement of the piston rod 48 from scattering into the internal space of the pod opener 30 and adversely affecting the wafer W. Further, the pod opener 30 of this embodiment includes four cassette support mechanisms 40. Accordingly, the cassette 3 can be supported in the vertical direction in such a manner that two cassette support mechanisms 40 respectively engage with the engagement members 13 at the symmetrical positions with respect to the center line Cl of the cassette 3. Additionally, the invention is not limited thereto. For example, the cassette support mechanism 40 may be disposed at each of the left and right positions or the cassette support mechanism 40 may be disposed at a plurality of positions.

Next, an operation of the pod opener 30 according to the embodiment of the invention will be described in details. The vacuum pod 4 transferred by the OHT is guided to a predetermined position of the pod stage 18 by the pod positioning member to be placed thereon (see FIG. 6). Next, when the key member 18a of the stage door 29 rotates by a predetermined amount, the engagement between the casing 15 and the bottom plate 14 is released and the bottom plate 14 and the stage door 29 engage with each other. Next, the stepping motor 35 of the elevating mechanism 34 is operated so as to move the stage door 29 downward. By the downward movement of the stage door 29, the bottom plate 14 engaging with the stage door 29 and the cassette 3 placed on the bottom plate 14 also start to move downward together. Further, the opening 28 is opened by the downward movement of the stage door 29 and the internal atmosphere of the pod opener 30 communicates with the internal atmosphere of the vacuum pod 4. At this time, since the opening 28 of the pod opener 30 is hermetically closed by the casing 15 of the vacuum pod 4, air does not enter the pod opener 30 from the outside.

Figure 8:
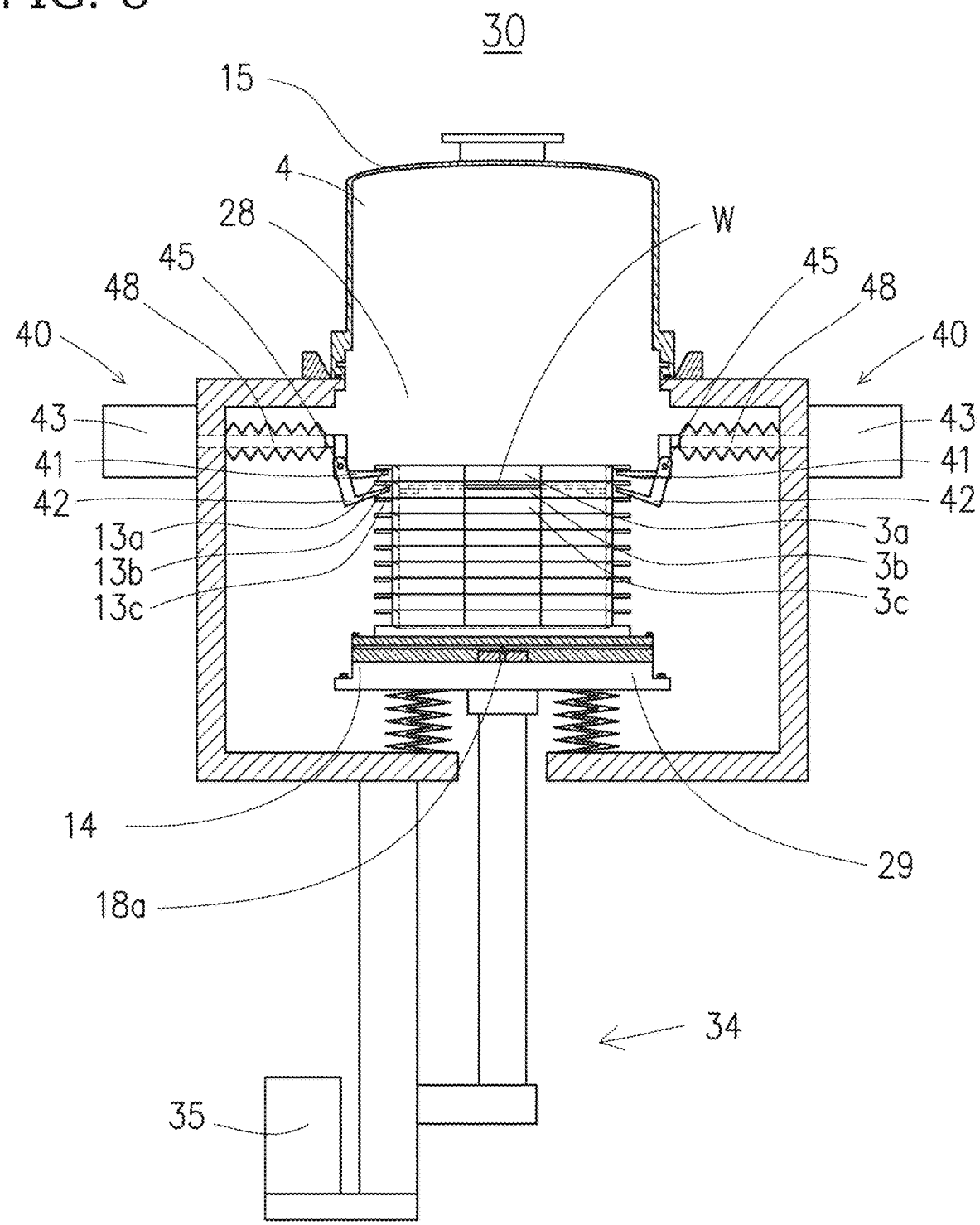
FIG. 8 is a cross-sectional view illustrating a state in which the cassette support mechanism according to the embodiment of the invention moves to a position in which the mechanism engages with a cassette.

When the stage door 29 moves downward to a predetermined position, the operation of the stepping motor 35 is stopped once. Additionally, in the description, the target wafer W is stored only in the cassette 3b at the ninth stage from below among the cassettes 3 stacked in ten stages and a predetermined position is a position in which the first hook member 41 can support the uppermost cassette 3a at the tenth stages and the second hook member 42 can support the cassette 3b at the ninth stage from below. When the stepping motor 35 is stopped once, the control unit operates the forward and backward movement mechanism 43 (the air cylinder) so that the piston rod 48 and the first and second hook members 41 and 42 move forward in the horizontal direction. At that time, the support surfaces of the first and second hook members 41 and 42 move to a position immediately below the engagement members 13a and 13b of the cassettes 3a and 3b (see FIG. 8). When the operation of the air cylinder is completed, the control unit operates the stepping motor 35 again so as to move the stage door 29 downward.

Since the engagement member 13a of the cassette 3a contacts the first hook member 41 by the downward movement of the stage door 29, the cassette 3a is supported by the first hook member 41 in the vertical direction. Further, when the downward movement of the stage door 29 is further continued, the engagement member 13b of the cassette 3b located immediately below the cassette 3a contacts the second hook member 42. Since the torsion spring 46 provided in the second hook member 42 does not have an urging force that supports the weight of the cassette 3b, the second hook member 42 continues the downward rotation around the shaft 45 serving as a fulcrum in accordance with the downward movement of the cassette 3b. Then, when the cassette support surface of the second hook member 42 rotates to a substantially horizontal position, the second hook member 42 comes into contact with the stopper 47 so that the downward rotation is regulated. Accordingly, the second hook member 42 is stopped at a posture in which the column portion 42b is substantially horizontal. With the above-described operation, the gap A through which the finger 9 can pass is formed between the cassette 3a and the cassette 3b.

Figure 9:
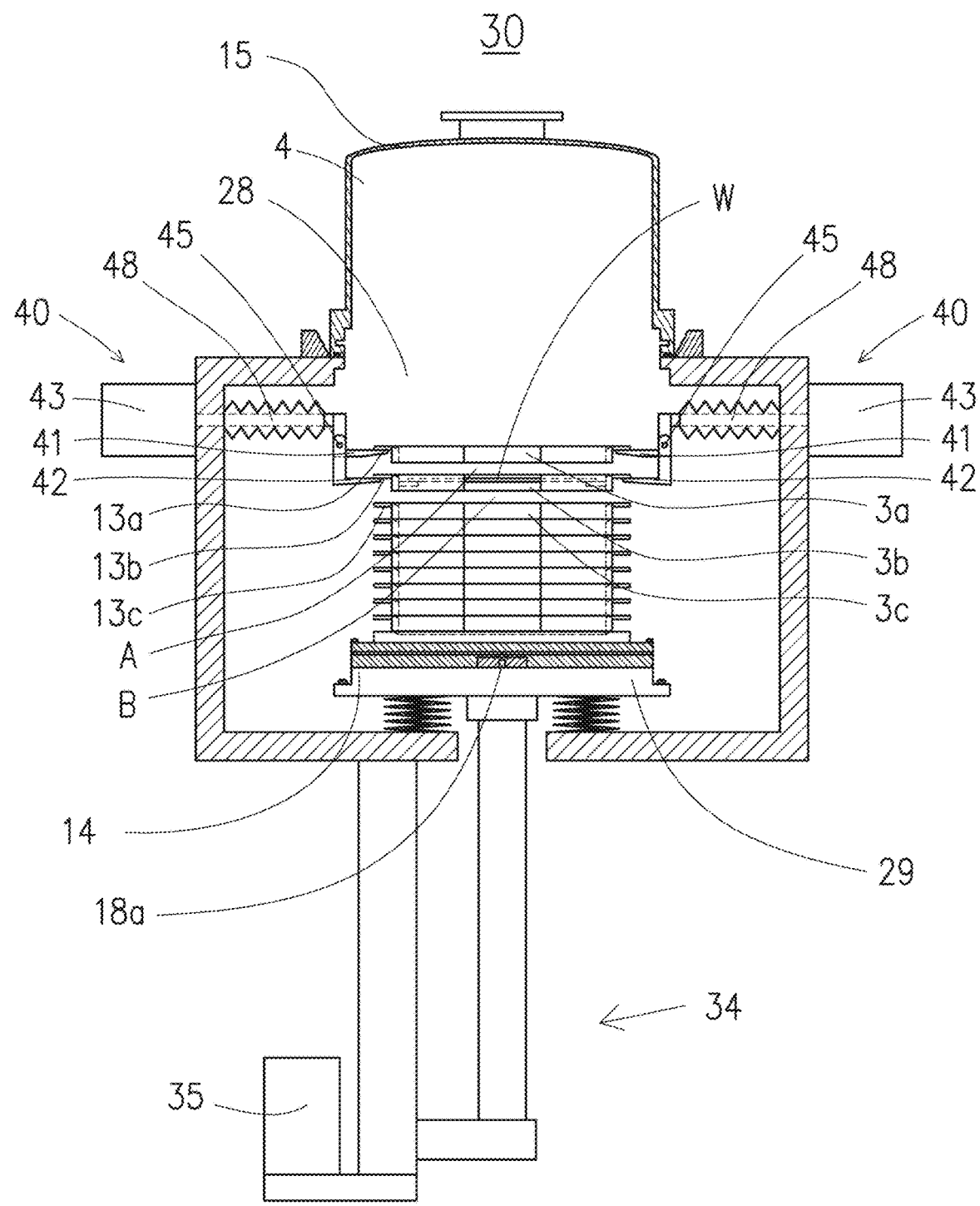
FIG. 9 is a cross-sectional view illustrating a state in which the cassette support mechanism according to the embodiment of the invention supports the cassettes.
Figure 10A:
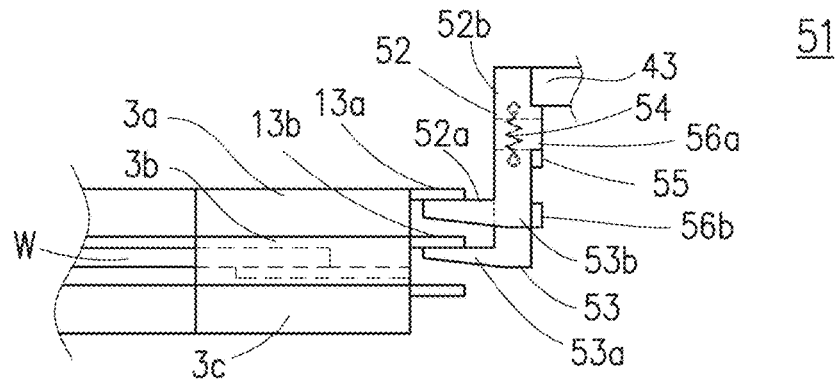
FIGS. 10A to 10D are views illustrating an outline of a cassette support mechanism according to another embodiment of the invention.
Figure 10B:
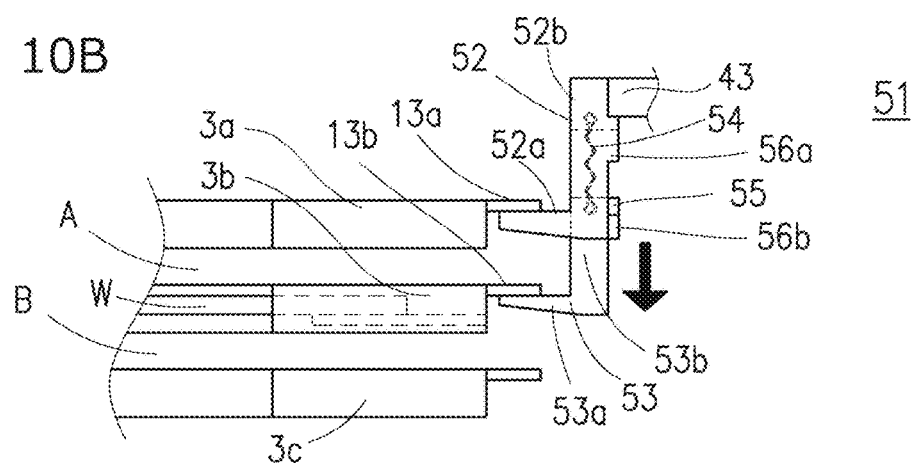
Figure 10C:
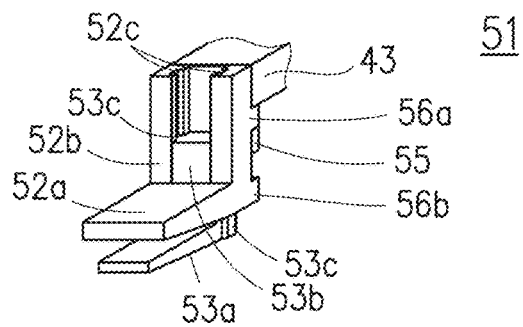
Figure 10D:
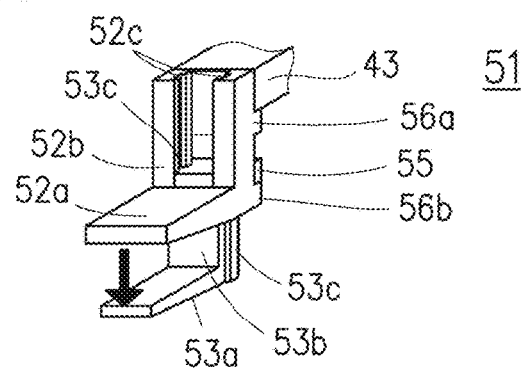

Even when the rotation operation of the second hook member 42 is stopped, the operation of the stepping motor 35 is not stopped. Then, the stage door 29 is moved downward to a predetermined position instructed in advance and the downward operation is stopped after the stage door reaches the predetermined position (see FIG. 9). By the above-described operation, the gap B through which the finger 9 of the vacuum transportation robot 6 can pass is formed between the cassette 3b and the cassette 3c disposed immediately therebelow. Here, the vacuum transportation robot 6 inserts the finger 9 between the cassette 3b and the cassette 3c through the gap B, moves the finger 9 to a position immediately below the wafer W supported by the cassette 3b, moves the finger upward to the gap A between the cassette 3b and the cassette 3a supported by the first hook member 41 so as to hold the wafer W, and transports the wafer W to the processing device 23 through the gap A formed between the cassette 3a and the cassette 3b. Further, when the wafer W is delivered from the processing device 23 to the cassette 3b, the vacuum transportation robot 6 moves the wafer W to a position immediately above the cassette 3b through the gap A by the finger 9 and moves the finger 9 downward to the gap B. In this way, the wafer W can be delivered onto the cassette 3b. When the wafer W is delivered to the cassette 3b, the vacuum transportation robot 6 moves the finger 9 to an original position through the gap B.

As described above, the pod opener 30 of the invention supports the cassette 3b to be accessed by the vacuum transportation robot 6 among the stacked cassettes 3 by the second hook member 42 and supports the cassette 3a disposed immediately therabove by the first hook member 41. With this simple structure, the gap A through which the finger 9 of the vacuum transportation robot 6 can pass is formed. This operation can be applied to the cassette 3 disposed at any stage by giving the position information of each of the stacked cassettes 3 to the control unit.

Next, an operation in which the wafer W is transported from the processing device 23 to the cassette 3b and is stored in the vacuum pod 4 will be described. When the access of the vacuum transportation robot 6 to the cassette 3 ends and the finger 9 moves to a predetermined position, the control unit operates the stepping motor 35 of the elevating mechanism 34 so as to move the stage door 29 upward. When the stage door 29 moves upward, the bottom plate 14 and the cassette 3 stacked on the bottom plate 14 also move upward so that the upper surface of the cassette 3c contacts the lower surface of the cassette 3b supported by the second hook member 42. Since the upper surface of the cassette 3c and the lower surface of the cassette 3b are formed in a tapered cross-section, the cassette 3c and the cassette 3b are positioned to a predetermined relative position as the cassette 3c moves upward.

The operation of the stepping motor 35 is continued even after the cassette 3c and the cassette 3b come into contact with each other and the upper surface of the cassette 3b contacts the lower surface of the cassette 3a supported by the first hook member 41. Since the stage door 29 continuously moves upward even after this state, the stage door moves upward to a position in which the hook members 41 and 42 do not contact the support surfaces of the engagement members 13a and 13b of the cassettes 3a and 3b. According the upward movement to this position, all cassettes 3 are supported by the stage door 29 and the operation of the stepping motor 35 is temporarily stopped. Next, the forward and backward movement mechanism 43 moves the first hook member 41 and the second hook member 42 backward from the cassette 3 in order to avoid a state in which the first hook member 41 and the second hook member 42 interfere with the upward movement of the cassette 3, the bottom plate 14, and the stage door 29. When the backward movement ends, the operation of the stepping motor 35 is resumed so that the cassette 3, the bottom plate 14, and the stage door 29 move upward. The operation of the stepping motor 35 is continued until the bottom plate 14 and the casing 15 are fitted to each other and the stage door 29 and the opening 28 are fitted to each other. When these members are fitted to each other and respectively reach a hermetically closed position, the control unit stops the operation of the stepping motor 35. By this upward movement, the internal space of the casing 15 is hermetically closed by the bottom plate 14 and the internal space of the pod opener 30 is hermetically closed by the stage door 29.

Next, the control unit rotates the key member 18a in the horizontal direction so that the engagement plate 19 protrudes toward the casing 15. Accordingly, the bottom plate 14 and the casing 15 engage with each other and the engagement between the bottom plate 14 and the stage door 29 is released. Accordingly, since the vacuum pod 4 can be transferred, an OHT ceiling transport vehicle receiving a command from a control computer in a factory holds the vacuum pod 4 and transfers the vacuum pod to the next process. The above-described operations are a series of operations of the pod opener 30 according to the embodiment of the invention.

Additionally, although the cassette support mechanism 40 of the pod opener 30 of this embodiment includes the second hook member 42 that is swingable with respect to the first hook member 41 and the torsion spring 46 which urges the second hook member 42 toward the first hook member 41, the invention is not limited thereto, and the cassette support mechanism may include other hook members.

FIGS. 10A to 10D are views illustrating a cassette support mechanism 51 according to a second embodiment of the invention. The cassette support mechanism 51 of this embodiment includes a first hook member 52, a second hook member 53 which is supported so as to be elevatable with respect to the first hook member 52, and an urging member 54 that urges the second hook member 53 toward the first hook member 52. In this embodiment, since the second hook member 53 is slidable in the vertical direction with respect to the first hook member 52, it is characterized in that an engagement portion 53a of the second hook member 53 can maintain a horizontal posture even when the cassette 3 is not supported. Accordingly, since the second hook member 53 does not interfere with the bottom plate 14 when the second hook member 53 moves forward and toward the cassette 3 at the lowest stage, the upper surface of the bottom plate 14 can have a flat shape. Additionally, in the cassette support mechanism 51 of this embodiment, a tension coil spring 54 is used as the urging member 54 that urges the second hook member 53 toward the first hook member 52. Further, an air cylinder is used as the forward and backward movement mechanism 43 which moves the first hook member 52 and the second hook member 53 forward and backward with respect to the cassette 3 similarly to the first cassette support mechanism 40.

In this embodiment, the rear surface of the second hook member 53 is provided with a protrusion 55 and the protrusion 55 comes into contact with an upper stopper 56a and a lower stopper 56b formed in the first hook member 52, so that the elevation of the second hook member 53 is regulated. A structure is obtained in which a column portion 53b extending in the vertical direction of the second hook member 53 is fitted to a column portion 52b of the first hook member 52. Further, the inner cross-section of the first hook member 52 has a concave shape and a convex portion 53c formed in the side surface of the second hook member 53 is fitted to a groove portion 52c having a concave shape. Accordingly, the second hook member 53 is movable within a vertical plane guided by the first hook member 52.

Figure 11A:
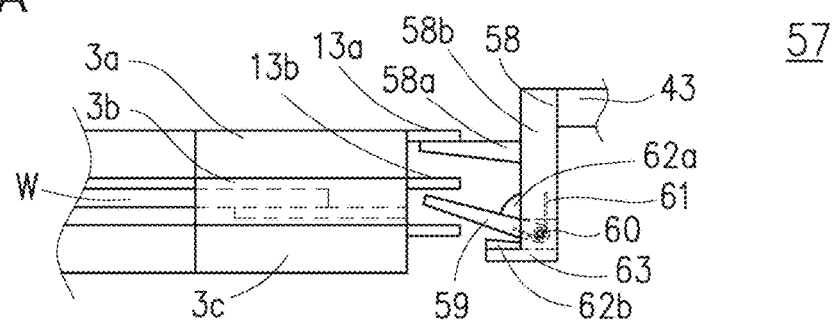
FIGS. 11A to 11D are views illustrating an outline of a cassette support mechanism according to another embodiment of the invention.
Figure 11B:
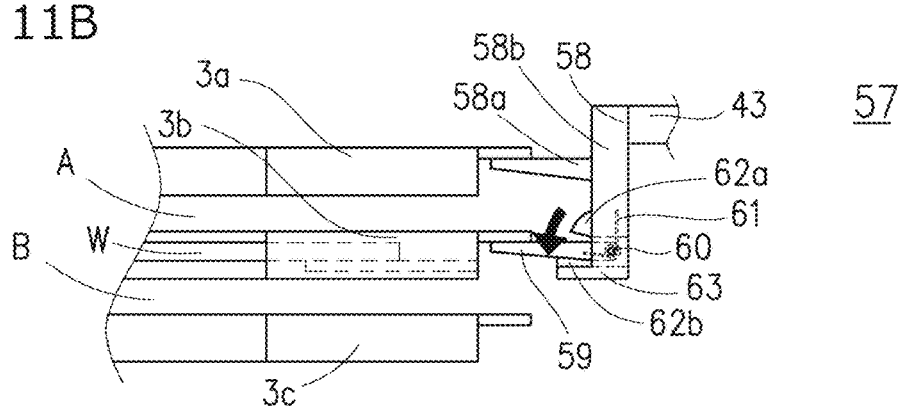

FIGS. 11A and 11B are views illustrating a cassette support mechanism 57 according to a third embodiment of the invention. In the cassette support mechanism 57 of this embodiment, a second hook member 59 is rotatably fixed to a column portion 58b of a first hook member 58 through a shaft 60. Further, an engagement portion 58a of the first hook member 58 is fixed to the column portion 58b while extending in the horizontal direction. The second hook member 59 of this embodiment is formed in a flat shape instead of the substantial L-shape as in the first and second embodiments and is urged in the clockwise rotation direction in the drawing around the shaft 60 by a torsion spring 61. Further, the column portion 58b of the first hook member 58 is provided with a stopper 62a which regulates the clockwise rotation of the second hook member 59 in the drawing. By the stopper 62, the second hook member 59 can be stopped at a position matching the vertical pitch of the engagement members 13 of the stacked cassettes 3 with respect to the engagement portion 58a of the first hook member 58.

Further, a plate 63 extending in the horizontal direction is provided at the lower portion of the first hook member 58 and the upper surface of the plate 63 is provided with a stopper 62b which comes into contact with the lower surface of the second hook member 59 so as to regulate the counter-clockwise rotation of the second hook member 59. By the stopper 62b, the second hook member 59 can maintain a horizontal posture even when the load of the cassette 3 is applied. Since the second hook member 59 is formed as a flat member, the movable range of the second hook member 59 can be decreased and cost can be reduced.

Figure 11C:
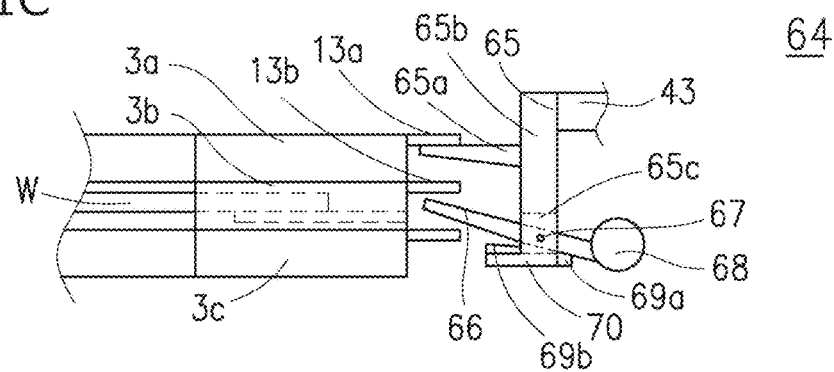
Figure 11D:
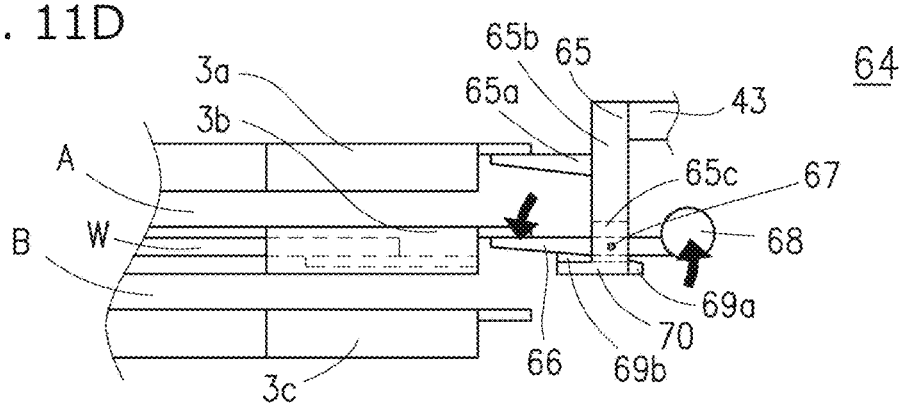

FIGS. 11C and 11D are views illustrating a cassette support mechanism 64 according to a fourth embodiment of the invention. In the cassette support mechanism 64 according to this embodiment, a second hook member 66 is rotatably fixed to a column portion 65b extending in the vertical direction of a first hook member 65 through a shaft 67 similarly to the third embodiment. Further, an engagement portion 65a of the first hook member 65 is fixed to the column portion 58b while extending in the horizontal direction. Further, the second hook member 66 of this embodiment has a flat shape similarly to the third embodiment and is urged in the clockwise rotation direction in the drawing around the shaft 67 by the urging member 68. The cassette support mechanism 64 of this embodiment is different from that of other embodiments in that the urging member 68 is not an elastic member like various springs 46, 54, and 61.

A weight 68 which is used as the urging member of this embodiment is disposed on the side opposite to the support side of the cassette 3 in the second hook member 66 with the shaft 67 interposed therebetween. A cavity 65c is formed in the column portion 65b of the first hook member 65 of this embodiment and the second hook member 66 of this embodiment is disposed so as to penetrate the cavity 65c. Further, the second hook member 66 is supported by the first hook member 65 so as to be rotatable through the shaft 67 like a lever. The weight 68 is fixed to an end portion on the side opposite to a portion supporting the cassette 3 in the second hook member 66. The fixing side of the weight 68 around the shaft 67 serving as a fulcrum is set to be heavier than the support side of the cassette 3 in the second hook member 66. When the load of the cassette 3 is not applied to the second hook member 66, the second hook member 66 is inclined toward the weight 68 around the shaft 67 serving as a fulcrum. Additionally, the weight 68 of this embodiment is formed of a resin similarly to the second hook member 66, but can be sufficiently formed of a metal material such as aluminum, stainless steel, or iron other than the resin.

Further, a stopper 69a is provided at the disposing side of the weight 68 below the first hook member 65 and the clockwise rotation of the second hook member 66 in the drawing is regulated after the second hook member comes into contact with the stopper 69a. Further, the second hook member 66 can be stopped by the stopper 69a at a position in which the vertical pitch of the engagement members 13 of the stacked cassettes 3 matches the engagement portion 65a of the first hook member 65.

Further, a plate 70 which extends in the horizontal direction is provided at the lower portion of the first hook member 65 and the upper surface of the plate 70 is provided with a stopper 69b which comes into contact with the lower surface of the second hook member 66 so as to regulate the counter-clockwise rotation of the second hook member 66. By the stopper 69b, the second hook member 66 can maintain a horizontal posture while the load of the cassette 3 is applied thereto.

As described above, various embodiments of the cassette support mechanism according to the invention have been described, but the invention can have a configuration in which the finger 9 can access the stacked cassettes 3 in such a manner that the second hook member can swing or slide by a simple structure. Further, the urging member that urges the second hook member toward the first hook member is set to have an urging force not capable of supporting the load of the cassette 3 when the load of the cassette 3 is applied to the second hook member. Accordingly, the second hook member can be displaced to a position separated from the first hook member when the load of the cassette 3 is applied to the second hook member and the second hook member can be brought closer to the first hook member when the load of the cassette 3 is not applied to the second hook member. Additionally, in this embodiment, an elastic body such as a torsion spring or a tension spring is used as the urging member, but other elastic bodies can be sufficiently used. Further, although an embodiment is also disclosed in which the weight is provided at one side of the second hook member around the shaft serving as a fulcrum instead of the elastic body and the other cassette support portion is brought closer to the first hook member, it is also sufficiently possible to provide the two types of urging members of the elastic body and the weight together in one support mechanism.

Further, the pod opener 30 of this embodiment is configured to maintain the inside in the vacuum atmosphere, but the invention is not limited thereto. For example, the inside of the pod opener 30 can be maintained in an inert gas atmosphere such as nitrogen or argon or a clean dry air (CDA) atmosphere and can be switched between a vacuum atmosphere and an atmosphere depending on the situation. Next, an embodiment of an atmospheric transport system S' including a pod opener 30' of an embodiment of the invention and a load port 71 for opening and closing a FOUP used under an atmospheric pressure will be described.

Figure 13:
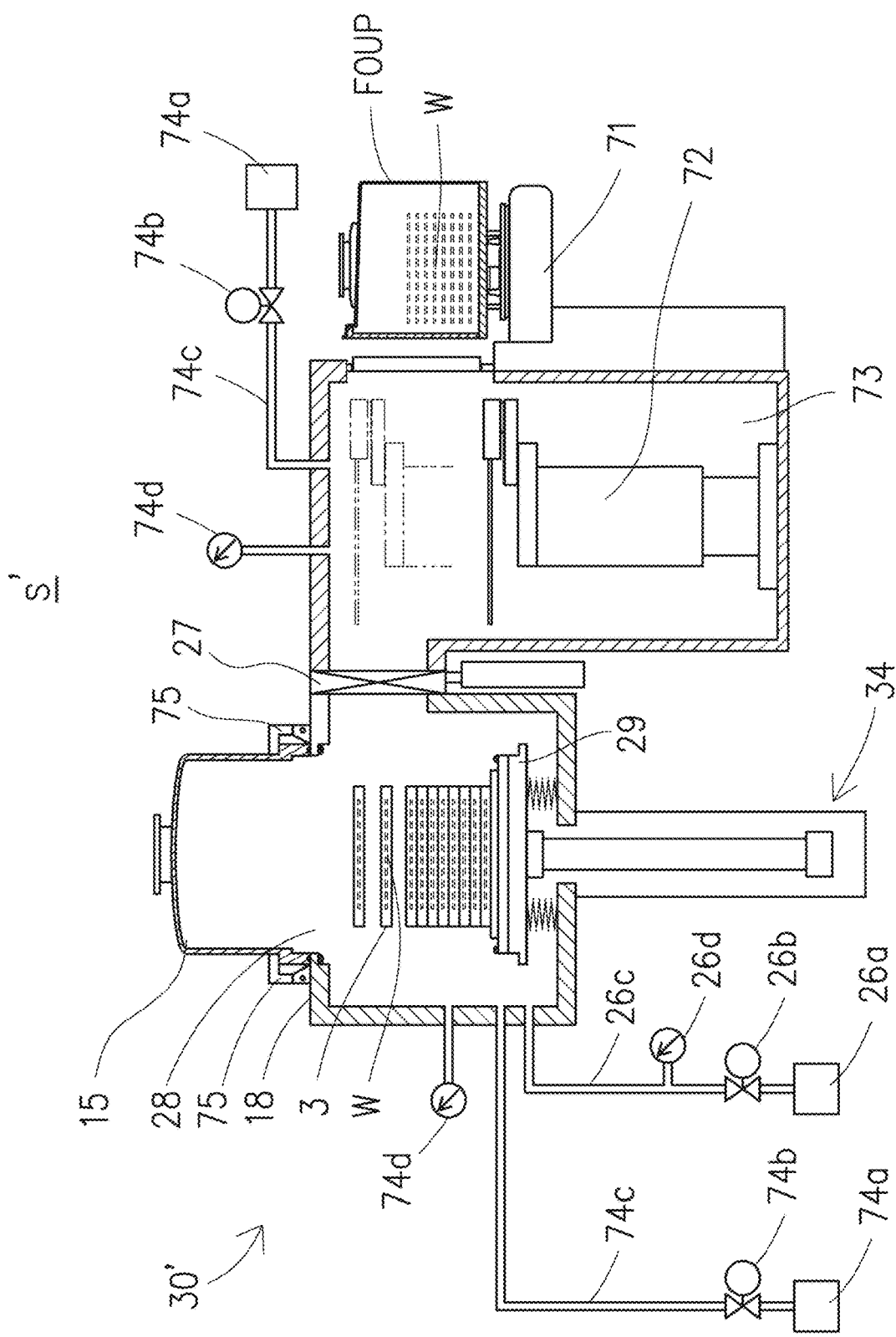
FIG. 13 is a cross-sectional view illustrating an atmospheric transportation system according to the embodiment of the invention.

FIG. 13 is a cross-sectional view illustrating an embodiment of an atmospheric transportation system S' of the invention. In order to avoid complicating the drawing, the cassette support mechanisms 40, 51, 57, and 64 that originally exist are not illustrated. The atmospheric transportation system S' of this embodiment includes a pod opener 30', an atmospheric transportation robot 72, an atmospheric transportation chamber 73 which stores the atmospheric transportation robot 72 therein, and the load port 71 which is fixed to the side surface of the atmospheric transportation chamber 73. In the atmospheric transportation system S' of this embodiment, the pod opener 30' and the atmospheric transportation chamber 73 are connected to each other through the gate valve 27 and can switch the communication state and the closed state by opening and closing the gate valve 27. Further, the other side surface of the atmospheric transportation chamber 73 is provided with a known load port 71 for mounting a FOUP, which is a sealed container capable of storing the wafer W therein, and opening and closing a door of the FOUP.

Further, a known atmospheric transportation robot 72 is disposed in the internal space of the atmospheric transportation chamber 73 and the atmospheric transportation robot 72 is able to hold the wafer W and transport the wafer W to a predetermined position. Further, the pod opener 30' of this embodiment is provided with an inert gas atmosphere maintaining device which maintains the internal space in the inert gas atmosphere in addition to the vacuum maintaining device that maintains the internal space in the vacuum atmosphere. The inert gas atmosphere maintaining device includes a supply source 74a which supplies an inert gas to the internal space of the pod opener 30' and a control valve 74b and the supply source 74a and the control valve 74b are connected to the internal space of the pod opener 30' through a pipe 74c. Further, a gas sensor 74d which measured the density of the inert gas inside the pod opener 30' is connected to the inside of the pod opener 30' through the pipe 74c. Further, the inert gas atmosphere maintaining device is also provided in the atmospheric transportation chamber 73 and the internal space of the atmospheric transportation chamber 73 is maintained in a predetermined inert gas atmosphere. Further, the pod opener 30' of this embodiment is provided with a fixing member 75 that fixes the casing 15 to the pod stage 18 of the pod opener 30'. Accordingly, it is possible to prevent the casing 15 from rising even when the internal space of the pod opener 30' is allowed to have a positive pressure by the inert gas.

When transporting the wafer W stored in the vacuum pod 4 to the FOUP, it is necessary to raise the pressure of the internal space of the pod opener 30' and the vacuum pod 4 maintained in the vacuum atmosphere to the pressure of the internal space of the atmospheric transportation chamber 73. First, the bottom plate 14 of the vacuum pod 4 is opened by the pod opener 30' maintained in the vacuum atmosphere, the cassette 3 is moved to the internal space of the pod opener 30', and the atmospheric transportation robot 72 can access the cassette 3 by the cassette support mechanism of the invention. At this time point in this state, the control valve 26b is operated so as to interrupt the communication between the vacuum pump 26a and the internal space of the pod opener 30'. Next, the control valve 74b is operated so that an inert gas is supplied from the supply source 74a into the internal space of the pod opener 30'. When the internal atmosphere of the pod opener 30' substantially matches the pressure of the atmospheric transportation chamber 73, the gate valve 27 hermetically closing the inside of the pod opener 30' and the inside of the atmospheric transportation chamber 73 is opened so that their internal spaces communicate with each other. When the pod opener 30' communicates with the internal space of the atmospheric transportation chamber 73, the wafer W is transported from the cassette 3 to the FOUP by the atmospheric transportation robot 72. When the wafer W is sequentially transported by the atmospheric transportation robot 72 and the transportation of the wafer W placed in each cassette 3 to the load port 71 ends, the door of the FOUP is closed and the FOUP is transferred to the next process.

Next, a procedure in which the internal space of the pod opener 30' is switched from the atmospheric pressure state to the vacuum pressure state after the transportation of the wafer W ends will be described. When the transportation of the wafer W from the FOUP to the vacuum pod 4 or the transportation of the wafer W from the vacuum pod 4 to the FOUP ends, the internal space of the pod opener 30' and the internal space of the atmospheric transportation chamber 73 are first hermetically isolated by the gate valve 27. Next, the pressure of the internal space of the pod opener 30' and the vacuum pod 4 is dropped to a predetermined vacuum pressure by the vacuum pump 26a of the pod opener 30'. When the pressure reaches the predetermined vacuum pressure, the elevating mechanism 34 is subsequently operated so that the bottom plate 14 and the stage door 29 move upward and the bottom plate 14 engages with the casing 15. Accordingly, the opening 28 is hermetically closed by the stage door 29. When the above-described operation is completed, the vacuum pod 4 is transferred to the next process.

As described above, it is possible to transport the wafer W between the vacuum pod 4 maintained in a vacuum pressure and the FOUP maintained in an atmospheric pressure by the pod opener 30' of this embodiment. In a semiconductor manufacturing process, there are a process in which the wafer W is preferably maintained in a vacuum atmosphere such as an etching process and a process in which the wafer W does not need to be in a vacuum atmosphere such as an inspection process. Further, in many cases, a process maintained in a vacuum atmosphere and a process maintained in an atmosphere exist together depending on the condition of a semiconductor manufacturing factory. In such a factory, the atmospheric transportation system S' of this embodiment can transport the wafer W between the FOUP and the vacuum pod 4 in a clean atmosphere that does not generate an unnecessary oxide film on the surface of the wafer W. Accordingly, the yield of semiconductor products can be improved.

As described above, the invention has been described with reference to the embodiments, but the invention is not limited to the above-described embodiments and can be modified and improved in various forms by the person skilled in the art. Further, these modifications and improvements are also included in the technical spirit of claims of the invention.

The invention claimed is:

1. A pod opener for placing a container, storing cassettes supporting substrates and stacked vertically, at a predetermined position and allowing the substrates supported by the cassettes to be accessible by a substrate holding member of a transportation device, comprising:
- an elevating mechanism elevating the stacked cassettes in a vertical direction;
- a first hook member engaging with an engagement means of a certain first cassette among the stacked cassettes and supporting the first cassette;
- a second hook member engaging with an engagement means of a second cassette disposed immediately below the first cassette supported by the first hook member and supporting the second cassette;
- a forward and backward movement mechanism moving the first hook member and the second hook member forward so as to be closer to the cassettes when engaging with the engagement means of the first and second cassettes and moving the first hook member and the second hook member backward so as to be away from the first and second cassettes when releasing the engagement from the engagement means of the first and second cassettes;
- an urging member urging the second hook member upward; and
- an atmosphere maintaining device maintaining an internal space having the cassette disposed therein in a predetermined atmosphere,
- wherein the second hook member is displaced upward by an urging force of the urging member when the second cassette is not supported and is displaced downward by a weight of the second cassette against the urging force of the urging member when the second cassette is supported.

2. The pod opener according to claim 1, wherein when the second hook member does not engage with the second cassette, a vertical pitch between an engagement portion of the first hook member and an engagement portion of the second hook member is substantially the same as a vertical pitch of each engagement means of the stacked cassettes.

3. The pod opener according to claim 2, wherein the urging member urging the second hook member is a torsion spring.

4. The pod opener according to claim 2, wherein the urging member urging the second hook member is a coil spring.

5. The pod opener according to claim 2, wherein the urging member urging the second hook member is a weight disposed on the side opposite to a portion supporting the second cassette by the second hook member with respect to a shaft serving as a fulcrum.

6. The pod opener according to claim 1, wherein the urging member urging the second hook member is a torsion spring.

7. The pod opener according to claim 1, wherein the urging member urging the second hook member is a coil spring.

8. The pod opener according to claim 1, wherein the urging member urging the second hook member is a weight disposed on the side opposite to a portion supporting the second cassette by the second hook member with respect to a shaft serving as a fulcrum.

9. A substrate processing system comprising:
- the pod opener according to claim 1;
- a vacuum transportation chamber having an internal space which communicates with the internal space of the pod opener;
- a process chamber connected to the internal space of the vacuum transportation chamber through a gate valve and configured to perform a process on a surface of a substrate of the substrates;
- a vacuum pump and a control valve configured to maintain both of the internal space of the pod opener and the internal space of the vacuum transportation chamber in a vacuum state; and a vacuum transportation robot stored in the internal space of the vacuum transportation chamber and configured to transport the substrate between the cassette and the process chamber when the gate valve is opened.

10. An atmospheric transportation system comprising:
- the pod opener according to claim 1;
- an atmospheric transportation chamber having an internal space which is connected to the internal space of the pod opener through a gate valve;
- an inert gas atmosphere maintaining device configured to maintain both of the internal space of the pod opener and the internal space of the atmospheric transportation chamber in an inert gas atmosphere;
- a load port fixed to a side surface of the atmospheric transportation chamber and configured to place an FOUP thereon; and
- an atmospheric transportation robot disposed in the internal space of the atmospheric transportation chamber which has an arm body provided with a finger at a front end of the arm body configured to hold and transport the substrate between the cassette and the FOUP when the gate valve is opened.

\* \* \* \* \*